US012604620B2

(12) United States Patent
Lee et al.

(10) Patent No.: US 12,604,620 B2
(45) Date of Patent: Apr. 14, 2026

(54) DISPLAY DEVICE

(71) Applicant: Samsung Display Co., LTD., Yongin-si (KR)

(72) Inventors: Yong Hee Lee, Suwon-si (KR); Jin Seon Kwak, Hwaseong-si (KR); Ji Hye Lee, Hwaseong-si (KR); Ki Hyun Pyo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 793 days.

(21) Appl. No.: 17/868,182

(22) Filed: Jul. 19, 2022

(65) Prior Publication Data

US 2023/0189583 A1     Jun. 15, 2023

(30) Foreign Application Priority Data

Dec. 9, 2021     (KR) ........................ 10-2021-0175805

(51) Int. Cl.
*H10K 59/131* (2023.01)
*H10H 20/857* (2025.01)
*H10K 59/122* (2023.01)

(52) U.S. Cl.
CPC ......... *H10K 59/131* (2023.02); *H10K 59/122* (2023.02); *H10H 20/857* (2025.01)

(58) Field of Classification Search
CPC .. H10K 59/131; H10K 59/122; H10H 20/857; H10H 29/142; H01L 25/0753; H10D 86/441
See application file for complete search history.

(56) References Cited

U.S. PATENT DOCUMENTS

2014/0168553 A1* 6/2014 Park ...................... G02F 1/1345
349/43
2018/0033852 A1* 2/2018 Kwon .................. G09G 3/2096
(Continued)

FOREIGN PATENT DOCUMENTS

| CN | 109616480 | 11/2020 |
| CN | 111968578 | 11/2020 |
| KR | 10-2062917 | 1/2020 |

OTHER PUBLICATIONS

European Partial Search Report for European Application No. 22198546.8, dated Apr. 4, 2023.

*Primary Examiner* — Steven B Gauthier
*Assistant Examiner* — Alvin L Lee
(74) *Attorney, Agent, or Firm* — Womble Bond Dickinson (US) LLP

(57) ABSTRACT

A display device includes a display area, a non-display area, a pad portion disposed in the non-display area and including first and second power pad portions, first and second voltage common lines that are disposed between the pad portion and the display area and spaced apart from each other, a first power pad disposed in the first power pad portion and electrically connected to the first voltage common line, a second power pad disposed in the second power pad portion and electrically connected to the second voltage common line, and first auxiliary lines electrically connected to the first voltage common line and second auxiliary lines electrically connected to the second voltage common line, the first and second auxiliary lines extending from the pad portion. The first auxiliary lines and the second auxiliary lines are spaced apart from the first power pad portion and the second power pad portion.

12 Claims, 23 Drawing Sheets

(56)  References Cited

U.S. PATENT DOCUMENTS

| | | | |
|---|---|---|---|
| 2018/0102083 A1* | 4/2018 | So | G09G 3/2085 |
| 2021/0151712 A1* | 5/2021 | Lee | H10K 59/80524 |
| 2021/0313498 A1 | 10/2021 | Kim et al. | |
| 2023/0008145 A1 | 1/2023 | Park et al. | |

* cited by examiner

WLC1        WLC2        LTU

CF1 BS1 SCT1 WLS1 CF2 BS2 SCT2 WLS2 CF3 BS3 SCT3

TFE

PRT
BK2 } CFL

43

CAP2

BK1 } WLCL

CAP1

41

30

BP

SE G1 DE

EML

BNL 19
17
15
13
12

TFTL

11

BML    ACTa ACTc   ACTb

ACT

BA1    LA1    BA2    LA2    BA3    LA3    BA1

DR3

DR2 → DR1

T1: ACT, G1, SE, DE

FIG. 6

T1 : ACT,G1,SE,DE

DISPLAY DEVICE

CROSS-REFERENCE TO RELATED APPLICATION(S)

This application claims priority to and benefits of Korean Patent Application No. 10-2021-0175805 under 35 U.S.C. 119, filed on Dec. 9, 2021 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED). Examples of the light emitting diode include an organic light emitting diode using an organic material as a light emitting material and an inorganic light emitting diode using an inorganic material as a light emitting material.

SUMMARY

Aspects of the disclosure provide a display device capable of stably applying a power signal from a pad portion to a display area.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a display area, a non-display area, a pad portion disposed in the non-display area and including a first power pad portion and a second power pad portion, a first voltage common line and a second voltage common line that are disposed between the pad portion and the display area and spaced apart from each other, a first power pad disposed in the first power pad portion and electrically connected to the first voltage common line, a second power pad disposed in the second power pad portion and electrically connected to the second voltage common line, first auxiliary lines electrically connected to the first voltage common line and extending from the pad portion, and second auxiliary lines electrically connected to the second voltage common line and extending from the pad portion. The first auxiliary lines and the second auxiliary lines may be spaced apart from the first power pad portion and the second power pad portion.

In an embodiment, the display device may further include data routing lines extending to the pad portion, and scan routing lines extending to the pad portion. The pad portion may include a data pad portion to which the data routing lines may be electrically connected, and a scan pad portion to which the scan routing lines may be electrically connected.

In an embodiment, the data pad portion may face the first voltage common line and the second voltage common line, the scan pad portion may be disposed between the first voltage common line and the data pad portion and between the second voltage common line and the data pad portion, the first power pad portion may be disposed on a side of the scan pad portion, and the second power pad portion may be disposed on another side of the scan pad portion.

In an embodiment, the first auxiliary lines may overlap at least one of the scan pad portion and the data pad portion, and the second auxiliary lines may overlap at least one of the scan pad portion and the data pad portion.

In an embodiment, the display device may further include first bridge layers disposed between the scan pad portion and the first voltage common line, and second bridge layers disposed between the scan pad portion and the second voltage common line. The first auxiliary lines may be electrically connected to the first voltage common line through the first bridge layer, and the second auxiliary lines may be electrically connected to the second voltage common line through the second bridge layer.

In an embodiment, the display device may further include first auxiliary pads and second auxiliary pads that may be disposed in the data pad portion. The first auxiliary lines may be electrically connected to the first auxiliary pads, and the second auxiliary lines may be electrically connected to the second auxiliary pads.

In an embodiment, the first voltage common line, the first auxiliary lines, and the first bridge layers may be disposed on different layers, and the second voltage common line, the second auxiliary lines, and the second bridge layers may be disposed on different layers.

In an embodiment, the first auxiliary pads and the first bridge layers may be disposed on a same layer, and the second auxiliary pads and the second bridge layers may be disposed on a same layer.

In an embodiment, the display device may further include scan pads disposed in the scan pad portion and to which the scan routing lines may be electrically connected, and data pads disposed in the data pad portion and to which the data routing lines may be electrically connected. The first auxiliary pads and the second auxiliary pads may be disposed between the data pads.

In an embodiment, the display device may further include first auxiliary pads and second auxiliary pads that are disposed in the scan pad portion. The first auxiliary lines may be electrically connected to the first auxiliary pads, and the second auxiliary lines may be electrically connected to the second auxiliary pads.

In an embodiment, the display device may further include scan pads disposed in the scan pad portion and to which the scan routing lines may be electrically connected, and data pads disposed in the data pad portion and to which the data routing lines may be electrically connected. The first auxiliary pads and the second auxiliary pads may be disposed between the data pads.

In an embodiment, the display device may further include a scan dummy line disposed between the first auxiliary lines, and a scan dummy pad to which the scan dummy line may be connected. The scan dummy line may be floating state.

According to an embodiment of the disclosure, a display device may include a display area, a non-display area, a pad portion disposed in the non-display area, a first voltage common line adjacent to the pad portion and disposed between the pad portion and the display area, a second voltage common line surrounding the first voltage common line and disposed between the pad portion and the display area, first auxiliary lines extending from the pad portion and electrically connected to the first voltage common line, and second auxiliary lines electrically connected to the second voltage common line. The first auxiliary lines may not overlap the second voltage common line, and the second auxiliary lines may overlap the first voltage common line.

In an embodiment, the pad portion may include a first power pad portion including a first power pad electrically connected to the first voltage common line, and a second power pad portion may include a second power pad electrically connected to the second voltage common line. The first power pad portion and the second power pad portion may be adjacent to each other.

In an embodiment, the pad portion may include a data pad portion parallel to the first voltage common line or the second voltage common line, and a scan pad portion disposed between the second voltage common line and the data pad portion. The data pad portion may include data pads electrically connected to data routing lines extending to the data pad portion, and the scan pad portion may include scan pads electrically connected to scan routing lines extending to the scan pad portion.

In an embodiment, the display device may further include first bridge layers disposed between the first voltage common line and the scan pad portion, and second bridge layers disposed between the first voltage common line and the second voltage common line. At least two of the first auxiliary lines may overlap and may be electrically connected to one of the first bridge layers, and at least two of the second auxiliary lines may overlap and may be electrically connected to one of the second bridge layers.

In an embodiment, at least two of the first auxiliary lines electrically connected to and overlapping one of the first bridge layers may be integral with each other, and at least two of the second auxiliary lines electrically connected to and overlapping one of the second bridge layers may be integral with each other.

In an embodiment, the first auxiliary lines and the second auxiliary lines may be disposed on a substrate, the first voltage common line and the second voltage common line may be disposed on the first auxiliary lines and the second auxiliary lines, and the first bridge layers and the second bridge layers may be disposed on the first voltage common line and the second voltage common line.

In an embodiment, the display device may further include first auxiliary pads electrically connected to the first auxiliary lines, and second auxiliary pads electrically connected to the second auxiliary lines. The first auxiliary pads and the second auxiliary pads may be disposed in the data pad portion.

In an embodiment, the first auxiliary lines may overlap the scan pad portion and the data pad portion, and the second auxiliary lines may overlap the scan pad portion, the data pad portion, and the first voltage common line.

In the display device according to embodiments, voltage signals may be uniformly applied to entire first and second voltage common lines through auxiliary lines as well as a region adjacent to a side of the driving integrated circuit IC. Accordingly, since uniform voltage signals may be applied throughout the first voltage common line and the second voltage common line, the display quality of the display device may be improved.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which:

FIG. 6 is a schematic cross-sectional view taken along lines Q1-Q1', Q2-Q2', and Q3-Q3' of FIG. 5;

DETAILED DESCRIPTION OF THE EMBODIMENTS

Figure 1:
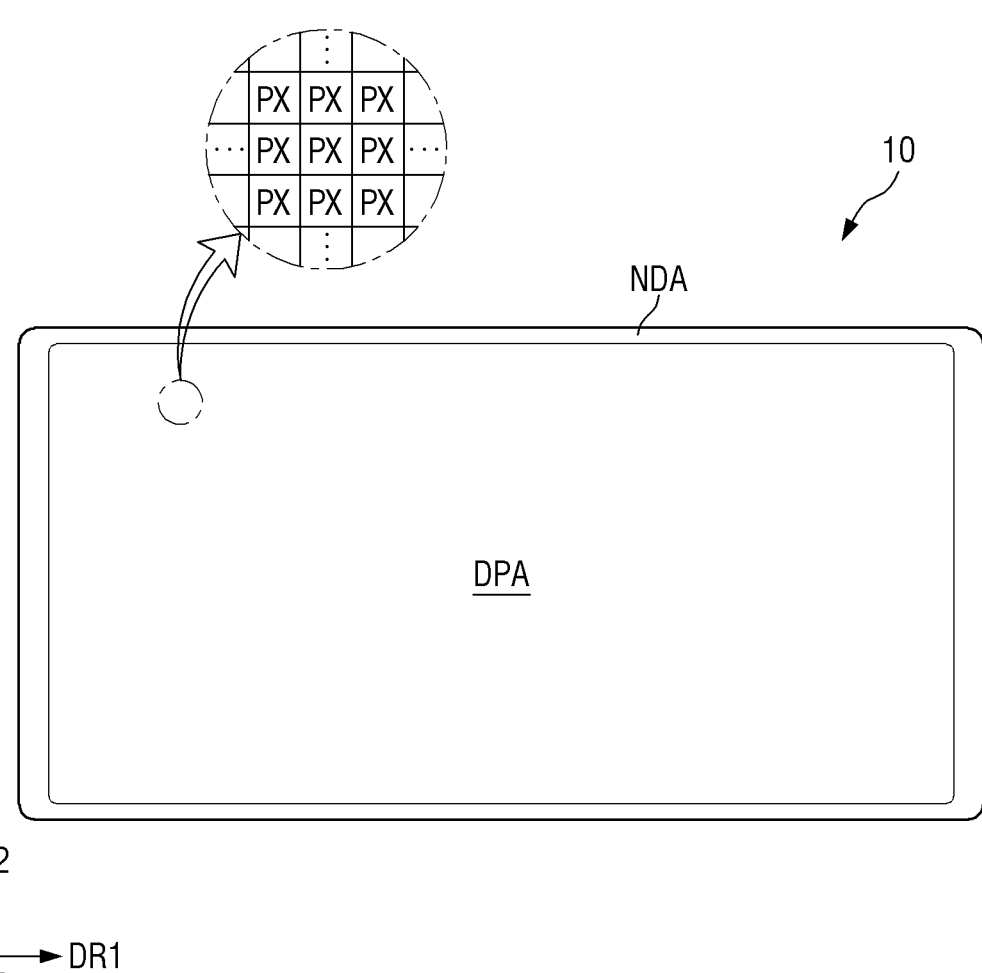
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

The terms "comprises," "comprising," "includes," "including,", "has," "have," "having," "contains", and "containing" and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

The terms "above," "top," and "top surface" as used herein may refer to an upward direction (i.e., a side of a third direction DR3) with respect to a display device 10. The terms "below," "bottom," and "bottom surface" as used herein may refer to another side of the third direction DR3. Further, "left," "right," "upper," and "lower" may indicate directions when the display device 10 is viewed from above. For example, "left" may indicate a side of a first direction DR1, "right" may indicate another side of the first direction DR1, "upper" may indicate a side of a second direction DR2, and "lower" may indicate another side of the second direction DR2.

Referring to FIG. 1, the display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be disclosed, but the disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. In FIG. 1, the display device 10 and the display area DPA having a rectangular shape elongated in the horizontal direction are illustrated.

The display device 10 may include the display area DPA and a non-display area NDA. The display area DPA may be an area where a screen can be displayed, and the non-display area NDA may be an area where a screen may not be displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and the shape may be a rhombic shape in which each side may be inclined with respect to a direction. The pixels PX may be alternately disposed in a stripe type arrangement or a PENTILE™ type arrangement. Each of the pixels PX may include one or more light emitting elements 30 that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
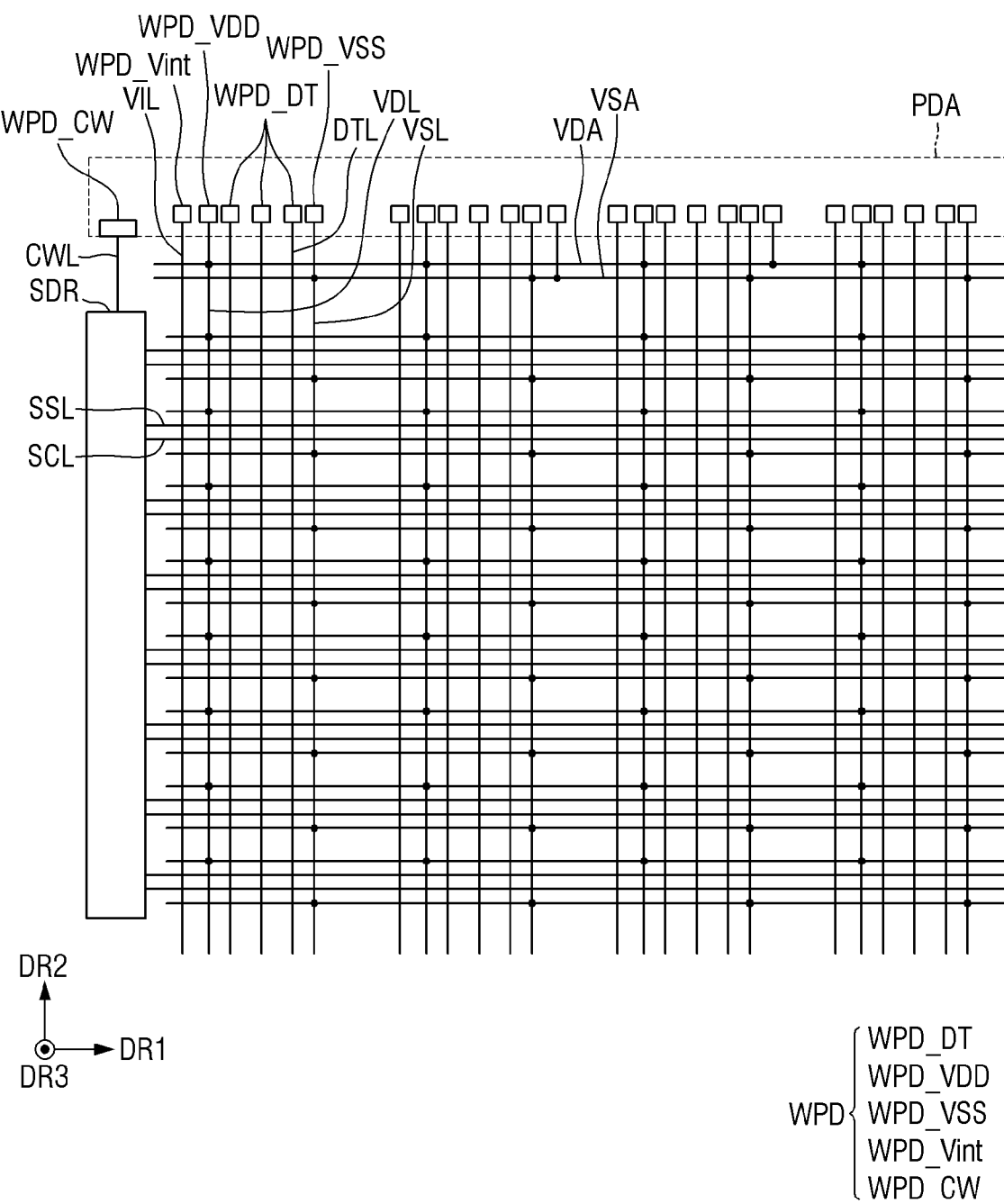
FIG. 2 is a schematic layout diagram showing wires included in a display device according to an embodiment.

FIG. 2 is a schematic layout diagram showing wires included in a display device according to an embodiment.

Referring to FIG. 2, the display device 10 may include wires. The wires may include a scan line SCL, a sensing line SSL, a data lines DTL, an initialization voltage line VIL, a first voltage line VDL, a second voltage line VSL, and the like. Although not shown in the drawing, other wires may be further provided in the display device 10.

The scan line SCL and the sensing line SSL may extend in a first direction DR1. The scan line SCL and the sensing line SSL may be connected to the scan driver SDR. The scan driver SDR may include a driving circuit. The scan driver SDR may be arranged on a side of the display area DPA in the first direction DR1, but is not limited thereto. The scan driver SDR may be connected to a scan routing line CWL, and at least one end of the scan routing line CWL may form a scan pad WPD_CW on the non-display area NDA to be connected to an external device.

The term "connected" as used herein may mean not only that one member may be connected to another member through a physical contact, but also that one member may be connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data line DTL and the initialization voltage line VIL may extend in a second direction DR2 intersecting the first direction DR1. Although not shown, the data line DTL may be connected to a data pad WPD_DT through a data routing line in the non-display area. The first voltage line VDL and the second voltage line VSL may be disposed to extend in the second direction DR2. The first voltage line VDL may be connected to a first voltage common line VDA extending in the first direction DR1 in the non-display area, and the second voltage line VSL may be connected to a second voltage common line VSA extending in the first direction DR1 in the non-display area. However, the disclosure is not limited thereto. Each pixel PX of the display device 10 may be connected to at least one data line DTL, the initialization voltage line VIL, the first voltage line VDL, and the second voltage line VSL.

The data line DTL, the initialization voltage line VIL, the first voltage line VDL, and the second voltage line VSL may be electrically connected to at least one wire pad WPD. Each line pad WPD may be disposed in the non-display area NDA. In an embodiment, a wire pad (WPD_DT, hereinafter referred to as "data pad") of the data line DTL, a wire pad (WPD_Vint, hereinafter "initialization voltage pad") of the initialization voltage line VIL, a wire pad (WPD_VDD, hereinafter "first power pad") of the first voltage line VDL, and a wire pad (WPD_VSS, hereinafter "second power pad") of the second voltage line VSL may be disposed in the pad area PDA on a side of the second direction DR2 of the display area DPA. The external devices may be mounted on the line pads WPD. The external devices may be mounted on the line pads WPD by applying an anisotropic conductive film, ultrasonic bonding or the like.

Each pixel PX or sub-pixel SPXn (n may be an integer of 1 to 3) of the display device 10 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to an embodiment, in each sub-pixel SPXn of the display device 10, the pixel driving circuit may have a 3T1C structure including three transistors and one capacitor. Hereinafter, the pixel driving circuit of the 3T1C structure will be described as an example, but the disclosure is not limited thereto, and various other modified pixel PX structures such as a 2T1C structure, a 7T1C structure, and a 6T1C structure may be applied.

Figure 3:
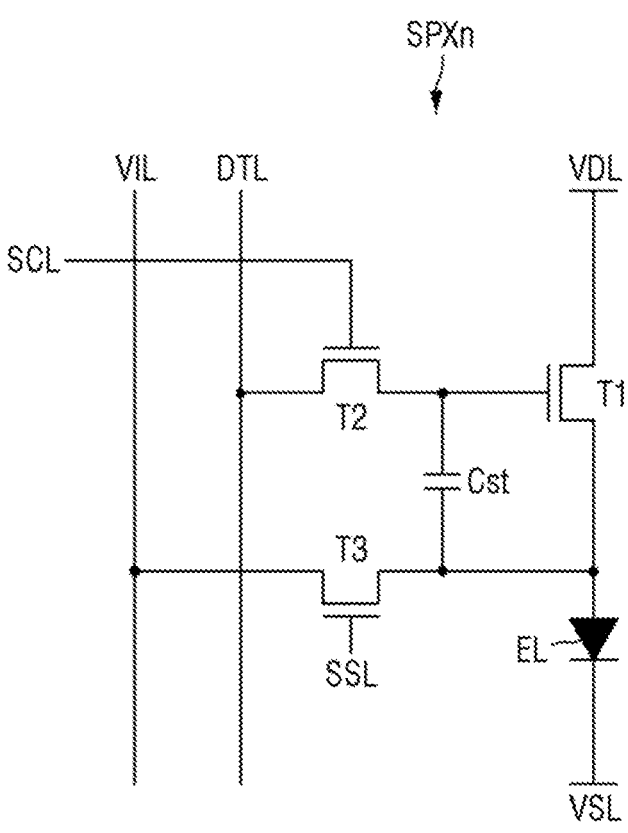
FIG. 3 is a schematic circuit diagram of a sub-pixel according to an embodiment.

FIG. 3 is a schematic circuit diagram of a sub-pixel according to an embodiment.

Referring to FIG. 3, each sub-pixel SPXn of the display device 10 according to an embodiment may include three transistors T1, T2 and T3 and a storage capacitor Cst in addition to a light emitting diode EL.

The light emitting diode EL may emit light by a current supplied through a first transistor T1. The light emitting diode EL may include a first electrode, a second electrode, and at least one light emitting element disposed between the first and second electrode. The light emitting element may emit light of a specific wavelength band by electrical signals transmitted from the first electrode and the second electrode.

An end of the light emitting diode EL may be connected to the source electrode of the first transistor T1, and another end thereof may be connected to the second voltage line VSL to which a low potential voltage (hereinafter, a second power voltage) lower than a high potential voltage (hereinafter, a first power voltage) of the first voltage line VDL may be supplied. Another end of the light emitting diode EL may be connected to the source electrode of the second transistor T2.

The first transistor T1 may adjust a current flowing from the first voltage line VDL, to which the first power voltage may be supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VDL to which the first power voltage may be applied.

The second transistor T2 may be turned on by a scan signal of the scan line SCL to connect the data line DTL to the gate electrode of the first transistor T1. The gate electrode of the second transistor T2 may be connected to the scan line SCL, the source electrode thereof may be connected to the gate electrode of the first transistor T1, and the drain electrode thereof may be connected to the data line DTL.

The third transistor T3 may be turned on by a sensing signal of the sensing line SSL to connect the initialization voltage line VIL to an end of the light emitting diode EL. The gate electrode of the third transistor T3 may be connected to the sensing line SSL, the drain electrode thereof may be connected to the initialization voltage line VIL, and the source electrode thereof may be connected to an end of the light emitting diode EL or to the source electrode of the first transistor T1.

In an embodiment, the source electrode and the drain electrode of each of the transistors T1, T2, and T3 are not limited to those described above, and vice versa. Further, each of the transistors T1, T2, and T3 may be formed of a thin film transistor. In FIG. 3, each of the transistors T1, T2, and T3 has been described as being formed of an N-type metal oxide semiconductor field effect transistor (MOS-FET), but is not limited thereto. For example, each of the transistors T1, T2, and T3 may be formed of a P-type MOSFET. In other embodiments, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst may store a difference voltage between a gate voltage and a source voltage of the first transistor T1.

Hereinafter, a structure of a pixel PX of the display device 10 according to an embodiment will be described in detail with further reference to other drawings.

Figure 4:
FIG. 4 is a cross-sectional view schematically illustrating a pixel of a display device according to an embodiment.

FIG. 4 is a cross-sectional view schematically illustrating a pixel of a display device according to an embodiment.

Referring to FIG. 4, the display area DPA of the display device 10 may include first to third emission areas LA1, LA2, and LA3. Each of the first to third emission areas LA1, LA2, and LA3 may be an area in which light generated from the light emitting element 30 of the display device 10 may be emitted to the outside of the display device 10.

The display device 10 may include a substrate 11, a buffer layer 12, a transistor layer TFTL, a light emitting element layer EML, a wavelength conversion layer WLCL, a color filter layer CFL, and an encapsulation layer TFE.

The substrate 11 may be a base substrate or a base member, and may be made of an insulating material such as polymer resin. For example, the substrate 11 may be a flexible substrate which can be bent, folded and rolled. The substrate 11 may include polyimide (PI), but is not limited thereto.

The buffer layer 12 may be disposed on the substrate 11. The buffer layer 12 may be formed of an inorganic layer that may be capable of preventing air or moisture infiltration. For example, the buffer layer 12 may include inorganic layers laminated alternately.

The transistor layer TFTL may be disposed on the buffer layer 12. The transistor layer TFTL may include the first transistor T1, a first gate insulating layer 13, a first interlayer insulating layer 15, a second interlayer insulating layer 17, and a first planarization layer 19.

The first transistor T1 may be disposed on the buffer layer BF, and may constitute a pixel circuit of each of the pixels. For example, the first transistor T1 may be a switching transistor or a driving transistor of the pixel circuit. The first transistor T1 may include an active layer ACT, a gate electrode G1, a source electrode SE, and a drain electrode DE. The active layer ACT may include conductive regions ACTa and ACTb and a channel region ACTc therebetween.

The light emitting element layer EML may be disposed on the transistor layer TFTL. The light emitting element layer EML may include a bank pattern BP, the light emitting element 30, and a bank BNL. The light emitting element 30 may be disposed on the first transistor T1. The light emitting element 30 may be disposed between the first electrode and the second electrode and may be connected to each of the first connection electrode and the second connection electrode.

A detailed description of the above-described transistor layer TFTL and light emitting element layer EML will be given later.

The second planarization layer 41 may be disposed on the light emitting element layer EML to planarize the top portion of the light emitting element layer EML. The second planarization layer 41 may include an organic material. For example, the second planarization layer 41 may include at least one of acryl resin, epoxy resin, phenolic resin, polyamide resin, and polyimide resin.

The wavelength conversion layer WLCL may include a first capping layer CAP1, a first light blocking member BK1, a first wavelength conversion member WLC1, a second wavelength conversion member WLC2, a light transmission member LTU, a second capping layer CAP2, and a third planarization layer 43.

The first capping layer CAP1 may be disposed on the second planarization layer 41 of the light emitting element layer EML. The first capping layer CAP1 may seal the bottom surfaces of the light transmission member LTU and the first and second wavelength conversion members WLC1 and WLC2. The first capping layer CAP1 may contain an inorganic material. For example, the first capping layer CAP1 may contain at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking member BK1 may be disposed in the first to third light blocking areas BA1, BA2, and BA3 on the first capping layer CAP1. The first light blocking member BK1 may overlap the bank BNL in the thickness direction. The first light blocking member BK1 may block transmission of light. The first light blocking member BK1 may prevent light infiltration and color mixture between the first to third emission areas LA1, LA2, and LA3, which leads to the improvement of color reproducibility. The first light blocking member BK1 may be arranged in the form of a grid surrounding the first to third emission areas LA1, LA2, and LA3 in plan view.

The first light blocking member BK1 may include an organic light blocking material and a lyophobic component. Here, the lyophobic component may be formed of fluorine-containing monomer or fluorine-containing polymer and, in detail, may include fluorine-containing aliphatic polycarbonate. For example, the first light blocking member BK1 may be made of a black organic material including the lyophobic component. The first light blocking member BK1 may be formed through a coating and exposure process of an organic light blocking material including the lyophobic component.

By including the lyophobic component, the first light blocking member BK1 may separate the first and second wavelength conversion members WLC1 and WLC2 and the light transmission member LTU into the corresponding emission areas LA. For example, in the case of forming the first and second wavelength conversion members WLC1 and WLC2 and the light transmission member LTU in an inkjet manner, the ink compositions may slide on the top surface of the first light blocking member BK1. The first light blocking member BK1 containing the lyophobic component may allow the ink composition to slide down to each emission area. Therefore, the first light blocking member BK1 may prevent the ink compositions from being mixed.

The first wavelength conversion member WLC1 may be disposed in the first emission area LA1 on the first capping layer CAP1. The first wavelength conversion member WLC1 may be surrounded by the first light blocking member BK1. The first wavelength conversion member WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, and imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a portion of the transmitted light. For example, the first scatterer SCT1 may contain metal oxide particles such as titanium oxide ($TiO_2$), zirconium oxide ($ZrO_2$), aluminum oxide (AlxOy), indium oxide ($In_2O_3$), zinc oxide (ZnO), and/or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light. The first wavelength shifter WLS1 may be a quantum dot, a quantum rod, and/or a fluorescent substance. The quantum dot may be a particulate material that emits light of a specific color in case that an electron transitions from a conduction band to a valence band.

For example, the quantum dot may be a semiconductor nanocrystal material. The quantum dot may have a specific band gap according to its composition and size. Thus, the quantum dot may absorb light and emit light having an intrinsic wavelength. Examples of semiconductor nanocrystal of quantum dots may include group IV nanocrystal, group II-VI compound nanocrystal, group III-V compound nanocrystal, group IV-VI nanocrystal, a combination thereof, or the like.

For example, the quantum dot may have a core-shell structure including a core containing the aforementioned nanocrystal and a shell surrounding the core. The shell of the quantum dot may act as a protective layer for maintaining semiconductor characteristics by preventing chemical denaturation of the core and as a charging layer for giving electrophoretic characteristics to the quantum dot. The shell may be formed of a single layer or multiple layers. An interface between the core and the shell may have a concentration gradient in which the concentration of elements present in the shell decreases toward the center. The shell of the quantum dot may be formed of a metallic or nonmetallic oxide, a semiconductor compound, or a combination thereof.

The light emitted from the first wavelength shifter WLS1 may have a full width of half maximum (FWHM) of the emission wavelength spectrum, which may be 45 nm or less, 40 nm or less, or 30 nm or less. Thus, the purity and reproducibility of colors displayed by the display device 10 may be further improved. The light emitted by the first wavelength shifter WLS1 may be emitted in various directions regardless of the incidence direction of the incident light. This makes it possible to improve lateral visibility of the red color displayed in the first emission area LA1.

A portion of the blue light emitted from the light emitting element layer EML may pass through the first wavelength conversion member WLC1 without being converted to red light by the first wavelength shifter WLS1. Among the blue light emitted from the light emitting element layer EML, the light incident on the first color filter CF1 without being converted by the first wavelength conversion member WLC1 may be blocked by the first color filter CF1. The red light produced by the first wavelength conversion member WLC1 converting the blue light emitted from the light emitting element layer EML may pass through the first color filter CF1 to be emitted to the outside. Accordingly, the red light may be emitted through the first emission area LA1.

The second wavelength conversion member WLC2 may be disposed in the second emission area LA2 on the first capping layer CAP1. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of the same material as the first base resin BS1, or may be made of the material disclosed in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a portion of the transmitted light. For example, the second scatterer SCT2 may be made of the same material as the first scatterer SCT1, or may be made of the material disclosed in association with the first scatterer SCT1. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of 510 nm to 550 nm and emit the green light. The second wavelength shifter WLS2 may be a quantum dot, a quantum rod, or a fluorescent substance. The second wavelength shifter WLS2 may contain the materials identical in purpose with the materials disclosed in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the first capping layer CAP1. The light transmission member LTU may be surrounded by the first light blocking member BK1. The light transmission member LTU may allow the incident light to pass therethrough while maintaining the peak wavelength of the light.

The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of the same material as the first base resin BS1 or the second base resin BS2, or may be made of the material disclosed in association with the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a portion of the transmitted light. For example, the third scatterer SCT3 may be formed of the same material as the first scatterer SCT1 or the second scatterer SCT2, or may be made of the material disclosed in association with the first scatterer SCT1 or the second scatterer SCT2. The third scatterer SCT3 may scatter the light in random directions regardless of the incidence direction of the incident light without any substantial change of the peak wavelength of the incident light.

Since the wavelength conversion layer WLCL may be disposed directly on the second planarization layer 41 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be readily aligned in the first to third emission areas LA1, LA2, and LA3, respectively, and the thickness of the display device 10 may be relatively reduced.

The second capping layer CAP2 may cover the first and second wavelength conversion members WLC1 and WLC2, the light transmission member LTU, and the first light blocking member BK1. For example, the second capping layer CAP2 may seal the first and second wavelength conversion members WLC1 and WLC2 and the light transmission member LTU to prevent the first and second wavelength conversion members WLC1 and WLC2 and the light transmission member LTU from damage or contamination. The second capping layer CAP2 may be made of the same material as the first capping layer CAP1, or may be made of the material disclosed in association with the first capping layer CAP1.

The third planarization layer 43 may be disposed on the second capping layer CAP2 to planarize top portions of the first and second wavelength conversion members WLC1 and WLC2 and the light transmission member LTU. The third planarization layer 43 may include an organic material. For example, the third planarization layer 43 may include at least one of acrylic resin, epoxy resin, phenolic resin, polyamide resin, and polyimide resin.

The color filter layer CFL may include a second light blocking member BK2, first to third color filters CF1, CF2, and CF3, and a passivation layer PRT.

The second light blocking member BK2 may be disposed in the first to third light blocking areas BA1, BA2, and BA3 on the third planarization layer 43 of the wavelength conversion layer WLCL. The second light blocking member BK2 may overlap the first light blocking member BK1 or the bank BNL in the thickness direction. The second light blocking member BK2 may block transmission of light. The second light blocking member BK2 may prevent light infiltration and color mixture between the first to third emission areas LA1, LA2, and LA3, which leads to the improvement of color reproducibility. The second light blocking member BK2 may be arranged in the form of a grid surrounding the first to third emission areas LA1, LA2, and LA3 in plan view.

The first color filter CF1 may be disposed in the first emission area LA1 on the third planarization layer 43. The first color filter CF1 may be surrounded by the second light blocking member BK2. The first color filter CF1 may overlap the first wavelength conversion member WLC1 in the thickness direction. The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant. The red colorant may include a red dye or a red pigment.

The second color filter CF2 may be disposed in the second emission area LA2 on the third planarization layer 43. The second color filter CF2 may be surrounded by the second light blocking member BK2. The second color filter CF2 may overlap the second wavelength conversion member WLC2 in the thickness direction. The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant. The green colorant may include a green dye or a green pigment.

The third color filter CF3 may be disposed in the third emission area LA3 on the third planarization layer 43. The third color filter CF3 may be surrounded by the second light blocking member BK2. The third color filter CF3 may overlap the light transmission member LTU in the thickness direction. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant. The blue colorant may include a blue dye or a blue pigment.

The first to third color filters CF1, CF2, and CF3 may absorb a portion of the light coming from the outside of the display device 10 to reduce the reflected light of the external light. Thus, the first to third color filters CF1, CF2, and CF3 can prevent color distortion caused by the reflection of the external light.

Since the first to third color filters CF1, CF2, and CF3 may be directly disposed on the third planarization layer 43 of the wavelength conversion layer WLCL, the display device 10 may not require a separate substrate for the first to third color filters CF1, CF2, and CF3. Therefore, the thickness of the display device 10 may be relatively reduced.

The third passivation layer PRT may cover the first to third color filters CF1, CF2, and CF3. The third passivation layer PRT may protect the first to third color filters CF1, CF2, and CF3.

The encapsulation layer TFE may be disposed on the third passivation layer PRT of the color filter layer CFL. The encapsulation layer TFE may cover the top and side surfaces of a display layer. For example, the encapsulation layer TFE may include at least one inorganic layer to prevent permeation of oxygen or moisture. The encapsulation layer TFE may include at least one organic layer to protect the display device 10 from foreign substances such as dust.

Hereinafter, the transistor layer TFTL and the light emitting element layer EML will be described in detail through the planar and cross-sectional structures of a pixel of the display device according to an embodiment.

Figure 5:
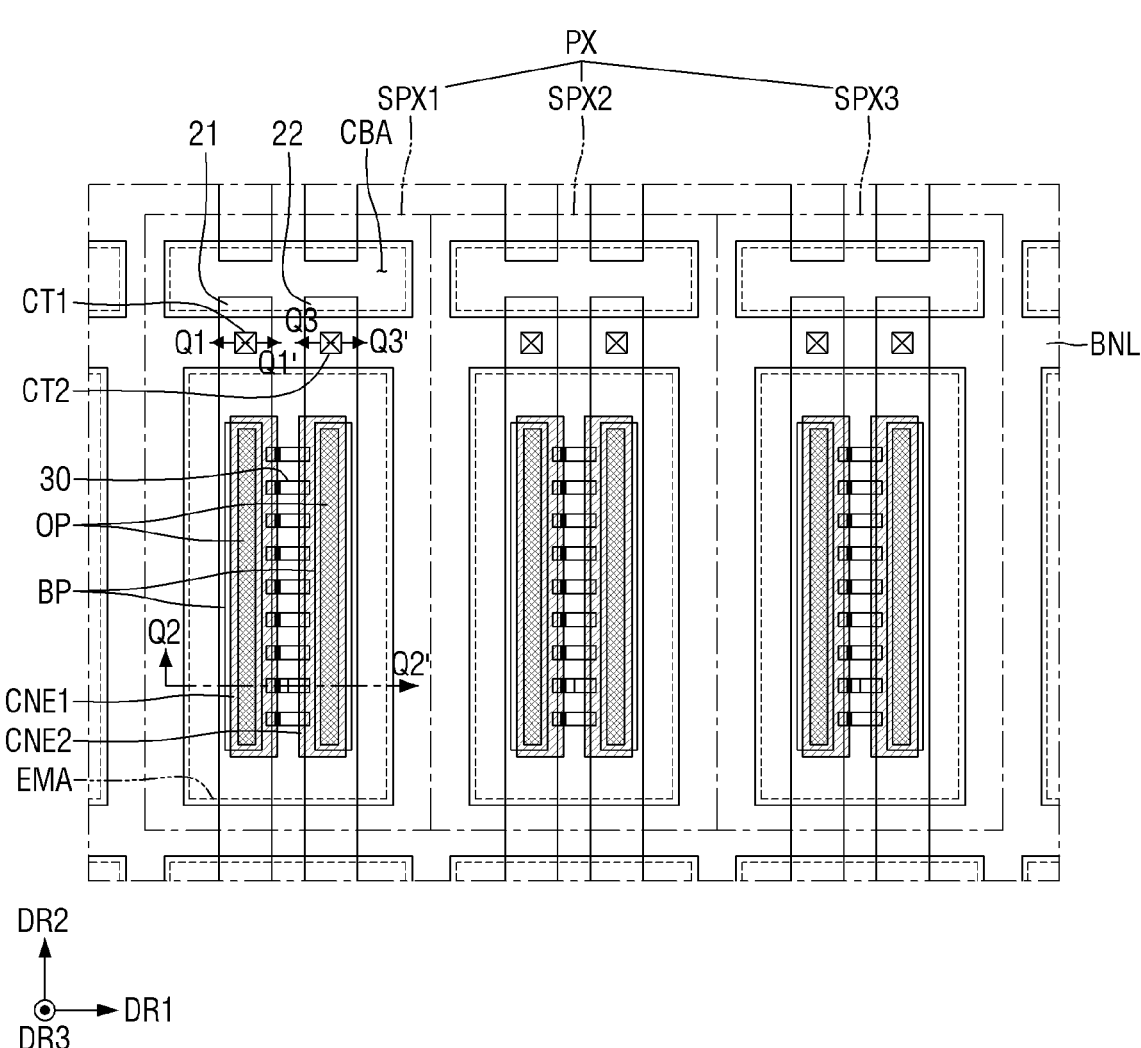
FIG. 5 is a schematic plan view illustrating a pixel of a display device according to an embodiment.

FIG. 5 is a schematic plan view illustrating a pixel of a display device according to an embodiment.

Referring to FIG. 5, each of the pixels PX may include sub-pixels SPXn (n being an integer of 1 to 3). For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. Although FIG. 5 illustrates that the pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area (not shown). In the emission area EMA, the light emitting element 30 may be disposed to emit light of a specific wavelength band. In the non-emission area, the light emitting element 30 may not be disposed and light emitted from the light emitting element 30 may not reach the non-emission area, so that no light may be emitted. The emission area may include an area in which the light emitting element 30 may be disposed, and an area adjacent to the light emitting element 30 to emit light emitted from the light emitting element 30.

Without being limited thereto, the emission area may also include an area in which the light emitted from the light emitting element 30 may be reflected or refracted by another member and emitted. The light emitting elements 30 may be disposed in each sub-pixel SPXn, and the emission area may be formed to include an area where the light emitting elements 30 may be disposed and an area adjacent thereto.

Each sub-pixel SPXn may further include a sub-region CBA disposed in the non-emission area. The sub-region CBA may be disposed on a side of the emission area EMA in a second direction DR2. The sub-region CBA may be disposed between the emission areas EMA of the sub-pixels SPXn adjacent in the second direction DR2. The emission areas EMA and sub-regions CBA may be arranged in the display area DPA of the display device 10. For example, the emission areas EMA and the sub-regions CBA may each be repeatedly disposed in a first direction DR1 and alternately disposed in the second direction DR2. The separation distance between the sub-regions CBA in the first direction DR1 may be smaller than the separation distance between the emission areas EMA in the first direction DR1. The bank BNL may be disposed between the sub-regions CBA and between the emission areas EMA, and the distance therebetween may vary with the width of the bank BNL. Although light may not be emitted from the sub-region CBA because of no light emitting element 30 disposed therein, a portion of electrodes 21 and 22 provided in each sub-pixel SPXn may be disposed in the sub-region CBA. The electrodes 21 and 22 provided in each sub-pixel SPXn may be disposed separately from each other in the sub-region CBA.

Figure 6:
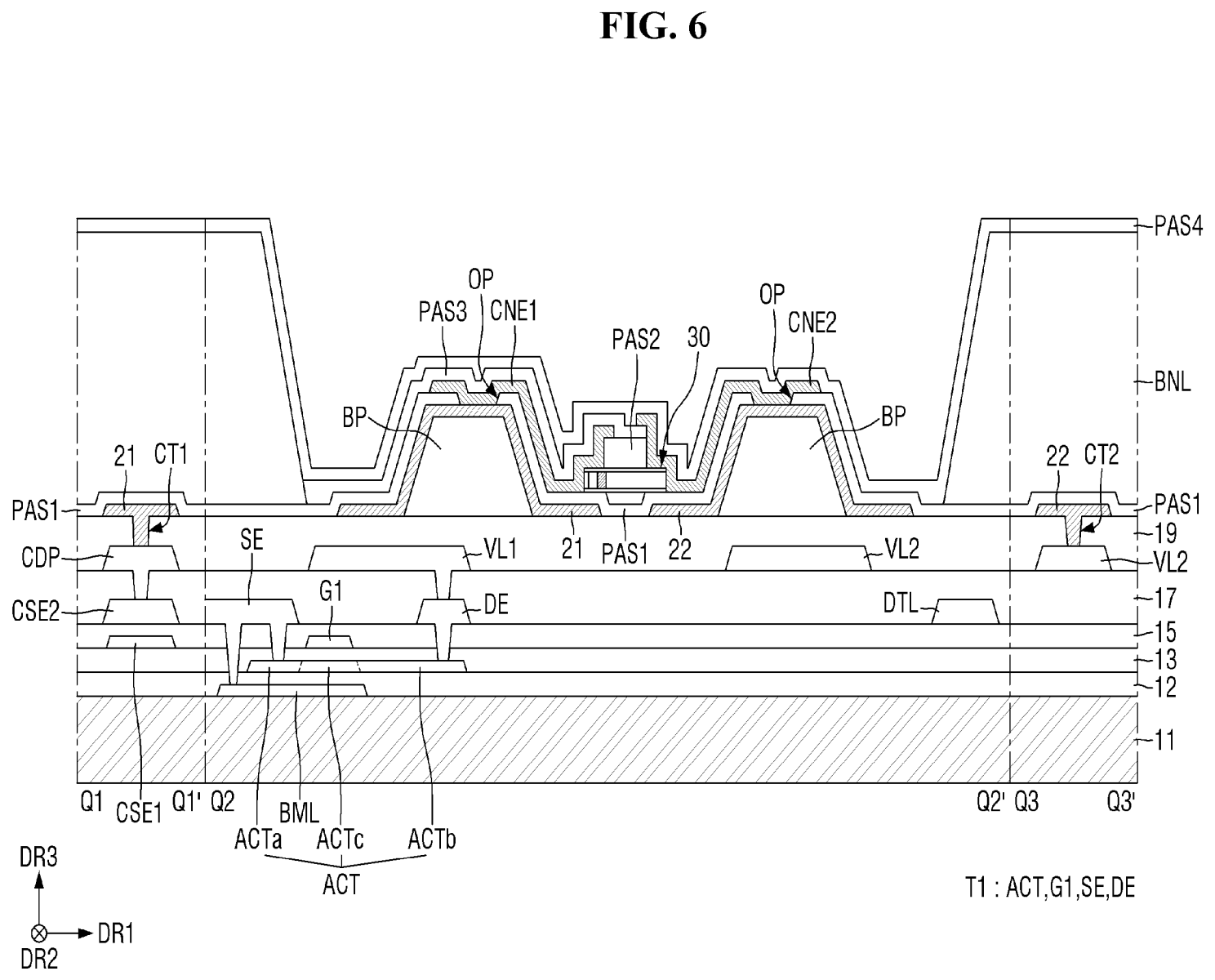

FIG. 6 is a schematic cross-sectional view taken along lines Q1-Q1', Q2-Q2', and Q3-Q3' of FIG. 5. FIG. 6 illustrates a cross-sectional view crossing both ends of the light emitting element 30 disposed in the first sub-pixel SPX1 of FIG. 5.

Referring to FIG. 6 together with FIG. 5, the display device 10 may include a substrate 11, and a semiconductor layer, conductive layers, and insulating layers disposed on the substrate 11. The semiconductor layer, the conductive layers, and the insulating layers may each constitute a circuit layer and a light emitting element layer of the display device 10.

A first lower conductive layer may be disposed on the substrate 11. The first lower conductive layer may include a light blocking layer BML. The light blocking layer BML, may be disposed to overlap an active layer ACT of a first transistor T1 of the display device 10. The light blocking layer BML may include a material that blocks light, thereby preventing light from entering the active layer ACT of the first transistor T1. For example, the light blocking layer BML may be formed of an opaque metal material that blocks transmission of light. However, the disclosure is not limited thereto, and in some cases, the light blocking layer BML may be omitted.

A buffer layer 12 may be entirely disposed on the substrate 11 including the light blocking layer BML. The buffer layer 12 may be formed on the substrate 11 to protect the first transistors T1 of the pixel PX from moisture permeating through the substrate 11 susceptible to moisture permeation, and may perform a surface planarization function. The buffer layer 12 may be formed of inorganic layers that may be alternately stacked on each other. For example, the buffer layer 12 may be formed of a multilayer in which inorganic layers including at least one of silicon oxide (SiOx), silicon nitride (SiNx), and silicon oxynitride (SiOxNy) may be alternately stacked on each other.

The semiconductor layer may be disposed on the buffer layer 12. The semiconductor layer may include the active layer ACT of the first transistor T1. These may be disposed to partially overlap a gate electrode G1 and the like of a first gate conductive layer, which will be described later.

Although only the first transistor T1 of the transistors included in the sub-pixel SPXn of the display device 10 are shown in the drawing, the disclosure is not limited thereto. The display device 10 may include more transistors. For example, the display device 10 may include two or three transistors for each sub-pixel SPXn by including one or more transistors in addition to the first transistor T1.

The semiconductor layer may include polycrystalline silicon, monocrystalline silicon, oxide semiconductor, and the like, or a combination thereof. In case that the semiconductor layer includes the oxide semiconductor, each active layer ACT may include conductive regions ACTa and ACTb and a channel region ACTc between them. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO) or the like, or a combination thereof.

In another embodiment, the semiconductor layer may include polycrystalline silicon. The polycrystalline silicon may be formed by crystallizing amorphous silicon. The conductive regions of the active layer ACT may be regions doped with impurities.

The first gate insulating layer 13 may be disposed on the semiconductor layer and the buffer layer 12. The first gate insulating layer 13 may be disposed on the buffer layer 12 including the semiconductor layer. The first gate insulating layer 13 may function as a gate insulating layer of each transistor. The first gate insulating layer 13 may be formed of an inorganic layer including an inorganic material, such as silicon oxide (SiOx), silicon nitride (SiNx) or silicon oxynitride (SiOxNy), or a stacked structure thereof.

The first gate conductive layer may be disposed on the first gate insulating layer 13. The first gate conductive layer may include the gate electrode G1 of the first transistor T1 and a first capacitive electrode CSE1 of a storage capacitor. The gate electrode G1 may be disposed to overlap a channel region ACTc of the active layer ACT in the thickness direction. The first capacitive electrode CSE1 may be disposed to overlap a second capacitive electrode CSE2 to be described later in the thickness direction. In an embodiment, the first capacitive electrode CSE1 may be connected to and integrated with the gate electrode G1. The first capacitive electrode CSE1 may be disposed to overlap the second capacitive electrode CSE2 in the thickness direction, and a storage capacitor may be formed therebetween.

The first gate conductive layer may be formed as a single layer or multiple layers made of at least one of molybdenum (Mo), aluminum (Al), chromium (Cr), gold (Au), titanium (T1), nickel (Ni), neodymium (Nd) and copper (Cu) or an alloy thereof. However, the disclosure is not limited thereto.

A first interlayer insulating layer 15 may be disposed on the first gate conductive layer. The first interlayer insulating layer 15 may function as an insulating layer between the first gate conductive layer and other layers disposed thereon. Further, the first interlayer insulating layer 15 may be arranged to cover the first gate conductive layer to protect the first gate conductive layer. The first interlayer insulating layer 15 may be formed of an inorganic layer including an inorganic material, such as silicon oxide (SiOx), silicon nitride (SiNx) or silicon oxynitride (SiOxNy), or a stacked structure thereof.

A first data conductive layer may be disposed on the first interlayer insulating layer 15. The first data conductive layer may include a first source electrode SE and a first drain electrode DE of the first transistor T1, a data line DTL, and the second capacitive electrode CSE2.

The first source electrode SE and the first drain electrode DE of the first transistor T1 may be in contact with the doped regions ACTa and ACTb of the active layer ACT through contact holes penetrating the first interlayer insulating layer 15 and the first gate insulating layer 13, respectively. Further, the first source electrode SE of the first transistor T1 may be electrically connected to the light blocking layer BML through another contact hole.

The data line DTL may apply a data signal to another transistor (not shown) included in the display device 10. Although not illustrated in the drawing, the data line DTL may be connected to a source/drain electrode of another transistor to transfer a signal applied from the data line DTL.

The second capacitive electrode CSE2 may be disposed to overlap the first capacitive electrode CSE1 in the thickness direction. In an embodiment, the second capacitive electrode CSE2 may be connected integrally with the first source electrode SE.

The first data conductive layer may be formed as a single layer or multiple layers made of at least one of molybdenum (Mo), aluminum (Al), chromium (Cr), gold (Au), titanium (T1), nickel (Ni), neodymium (Nd) and copper (Cu) or an alloy thereof. However, the disclosure is not limited thereto.

A second interlayer insulating layer 17 may be disposed on the first data conductive layer. The second interlayer insulating layer 17 may function as an insulating layer between the first data conductive layer and other layers disposed thereon. The second interlayer insulating layer 17 may cover the first data conductive layer and function to protect the first data conductive layer. The second interlayer insulating layer 17 may be formed of an inorganic layer including an inorganic material, such as silicon oxide (SiOx), silicon nitride (SiNx) or silicon oxynitride (SiOxNy), or a stacked structure thereof.

The second data conductive layer may be disposed on the second interlayer insulating layer 17. The second data conductive layer may include a first voltage line VL1, a second voltage line VL2, and a first conductive pattern CDP. The first voltage line VL1 may be applied with a high potential voltage (or a first source voltage) supplied to the first transistor T1, and the second voltage line VL2 may be applied with a low potential voltage (or a second source voltage) supplied to the second electrode 22. Also, during the manufacturing process of the display device 10, the second voltage line VL2 may be applied with an alignment signal required to align the light emitting element 30.

The first conductive pattern CDP may be connected to a second capacitive electrode CSE2 through a contact hole formed in the second interlayer insulating layer 17. The second capacitive electrode CSE2 may be integrated with the first source electrode SE of the first transistor T1, and the first conductive pattern CDP may be electrically connected to the first source electrode SE. The first conductive pattern CDP may also be in contact with the first electrode 21 to be described later, and the first transistor T1 may transfer the first source voltage applied from the first voltage line VL1 to the first electrode 21 through the first conductive pattern CDP. Although it is illustrated in the drawing that the second data conductive layer includes one second voltage line VL2 and one first voltage line VL1, the disclosure is not limited thereto. The second data conductive layer may include a larger number of first voltage lines VL1 and second voltage lines VL2.

The second data conductive layer may be formed as a single layer or multiple layers made of at least one of molybdenum (Mo), aluminum (Al), chromium (Cr), gold (Au), titanium (T1), nickel (Ni), neodymium (Nd) and copper (Cu) or an alloy thereof. However, the disclosure is not limited thereto.

A first planarization layer 19 may be disposed on the second data conductive layer. The first planarization layer 19 may include an organic insulating material, for example, an organic material such as polyimide (PI), to perform a surface planarization function.

Bank patterns BP, electrodes 21 and 22, the light emitting element 30, connection electrodes CNE1 and CNE2, and a bank BNL may be disposed on the first planarization layer 19. Further, insulating layers PAS1, PAS2, PAS3, and PAS4 may be disposed on the first planarization layer 19.

The bank patterns BP may be directly disposed on the first planarization layer 19. The bank patterns BP, which have a shape extending in the second direction DR2 within each sub-pixel SPXn without extending to other sub-pixels SPXn adjacent in the second direction DR2, may be disposed in the emission area EMA. The bank patterns BP may be disposed to be spaced apart from each other in the first direction DR1, and the light emitting element 30 may be disposed therebetween. The bank patterns BP may be disposed for each sub-pixel SPXn to form a linear pattern in the display area DPA of the display device 10. In the drawing, two bank patterns BP are illustrated, but the disclosure is not limited thereto. A larger number of bank patterns BP may be disposed depending on the number of the electrodes 21 and 22.

The bank pattern BP may have a structure in which at least a part thereof protrudes from the top surface of the first planarization layer 19. The protruding portion of the bank pattern BP may have an inclined side surface, and the light emitted from the light emitting element 30 may be reflected from the electrodes 21 and 22 disposed on the bank pattern BP to be emitted in an upward direction of the first planarization layer 19. The bank pattern BP may provide a region in which the light emitting element 30 may be disposed, and may also function as a reflective partition wall or bank that reflects light emitted from the light emitting element 30 upward. The side surface of the bank pattern BP may be inclined in a linear shape, but is not limited thereto, and the outer surface of the bank pattern BP may have a curved semi-circle or semi-ellipse shape. The bank pattern BP may include an organic insulating material such as polyimide (PI), but is not limited thereto.

The electrodes 21 and 22 may be disposed on the bank pattern BP and the first planarization layer 19. The electrodes 21 and 22 may include a first electrode 21 and a second electrode 22. The first electrode 21 and the second electrode 22 may extend in the second direction DR2, and may be disposed to be spaced apart from each other in the first direction DR1.

Each of the first electrode 21 and the second electrode 22 may extend in the second direction DR2 within the sub-pixel SPXn, but may be separated from the other electrodes 21 and 22 in the sub-region CBA. For example, the sub-region CBA may be disposed between the emission areas EMA of the sub-pixels SPXn adjacent in the second direction DR2, and the first electrode 21 and the second electrode 22 may be separated from the other first electrode 21 and second electrode 22 disposed in the sub-pixel SPXn adjacent in the second direction DR2 in the sub-region CBA. However, the disclosure is not limited thereto, and some of the electrodes 21 and 22 may be arranged to extend beyond the adjacent sub-pixel SPXn in the second direction DR2 without being separated for each sub-pixel SPXn, or only one of the first electrode 21 and the second electrode 22 may be separated.

The first electrode 21 may be electrically connected to the first transistor T1 through a first electrode contact hole CT1, and the second electrode 22 may be electrically connected to the second voltage line VL2 through a second electrode contact hole CT2. For example, the first electrode 21 may be in contact with the first conductive pattern CDP through the first electrode contact hole CT1 penetrating the first planarization layer 19 in a portion of the bank BNL extending in the first direction DR1. The second electrode 22 may be in contact with the second voltage line VL2 through the second electrode contact hole CT2 penetrating the first planarization layer 19 in the portion of the bank BNL extending in the first direction DR1. However, the disclosure is not limited thereto. In another embodiment, the first electrode contact hole CT1 and the second electrode contact hole CT2 may be disposed in the emission area EMA surrounded by the bank BNL so as not to overlap the bank BNL.

In the drawing, one first electrode 21 and one second electrode 22 are disposed for each sub-pixel SPXn, but the disclosure is not limited thereto, and a larger number of the first electrodes 21 and a larger number of the second electrodes 22 may be disposed in the sub-pixel SPXn. The first electrode 21 and the second electrode 22 disposed in each sub-pixel SPXn may not necessarily have a shape extending in a direction, and the first electrode 21 and the second electrode 22 may be arranged in various structures. For example, the first electrode 21 and the second electrode 22 may have a partially curved or bent shape, and one electrode may be disposed to surround the other electrode.

The first electrode 21 and the second electrode 22 may be directly disposed on the bank patterns BP, respectively. Each of the first electrode 21 and the second electrode 22 may be formed to have a larger width than that of the bank pattern BP. For example, each of the first electrode 21 and the second electrode 22 may be disposed to cover the outer surface of the bank pattern BP. The first electrode 21 and the second electrode 22 may be disposed on the side surfaces of the bank pattern BP, respectively, and a distance between the first electrode 21 and the second electrode 22 may be smaller than a distance between the bank patterns BP. Further, at least a portion of the first electrode 21 and at least a portion of the second electrode 22 may be directly disposed on the first planarization layer 19, so that they may be disposed on the same plane. However, the disclosure is not limited thereto. In some cases, each of the electrodes 21 and 22 may have a width smaller than that of the bank pattern BP. However, each of the electrodes 21 and 22 may be disposed to cover at least one side surface of the bank pattern BP to reflect light emitted from the light emitting element 30.

Each electrode 21, 22 may include a conductive material having high reflectivity. For example, each electrode 21, 22 may include a metal such as silver (Ag), copper (Cu), and/or aluminum (Al) as a material having high reflectivity, or may be an alloy including aluminum (Al), nickel (Ni), lanthanum (La), and the like, or a combination thereof. Each electrode 21, 22 may reflect, in the upward direction of each sub-pixel SPXn, light emitted from the light emitting element 30 and traveling to the side surface of the bank pattern BP.

However, the disclosure is not limited thereto, and each of the electrodes 21 and 22 may further include a transparent conductive material. For example, each electrode 21, 22 may include a material such as indium tin oxide (ITO), indium zinc oxide (IZO), and indium tin zinc oxide (ITZO). In some embodiments, each of the electrodes 21 and 22 may have a structure in which at least one transparent conductive material and at least one metal layer having high reflectivity may be stacked on each other, or may be formed as one layer including them. For example, each electrode 21, 22 may have a stacked structure such as ITO/silver (Ag)/ITO, ITO/Ag/IZO, or ITO/Ag/ITZO/IZO.

The electrodes 21 and 22 may be electrically connected to the light emitting elements 30 and may be applied with a voltage to allow the light emitting elements 30 to emit light. For example, the electrodes 21 and 22 may be electrically connected to the light emitting elements 30 through the connection electrodes CNE1 and CNE2 to be described later, and the electrical signals applied to the electrodes 21 and 22 may be transferred to the light emitting elements 30 through the connection electrodes CNE1 and CNE2.

One of the first electrode 21 and the second electrode 22 may be electrically connected to an anode electrode of the light emitting element 30, and the other one thereof may be electrically connected to a cathode electrode of the light emitting element 30. However, the disclosure is not limited thereto, and an opposite case may also be possible.

Further, each of the electrodes 21 and 22 may be used to form an electric field in the sub-pixel SPXn to align the light emitting elements 30. The light emitting elements 30 may be disposed between the first electrode 21 and the second electrode 22 by an electric field formed on the first electrode 21 and the second electrode 22. The light emitting elements 30 of the display device 10 may be injected onto the electrodes 21 and 22 through an inkjet printing process. In case that inks including the light emitting elements 30 may be injected onto the electrodes 21 and 22, an alignment signal may be applied to the electrodes 21 and 22 to generate an electric field. The light emitting elements 30 dispersed in the inks may be aligned on the electrodes 21 and 22 by receiving the dielectrophoretic force by the electric field generated on the electrodes 21 and 22.

The first insulating layer PAS1 may be disposed on the first planarization layer 19. The first insulating layer PAS1 may be disposed to cover the bank patterns BP and the first and second electrodes 21 and 22. The first insulating layer PAS1 may protect the first electrode 21 and the second electrode 22 while insulating them from each other. Further, it may be possible to prevent the light emitting element 30 disposed on the first insulating layer PAS1 from being damaged by direct contact with other members.

In an embodiment, the first insulating layer PAS1 may include an opening OP partially exposing the first electrode 21 and the second electrode 22. Each opening OP may partially expose a portion of the electrodes 21 and 22 disposed on the top surface of the bank pattern BP. Some of the connection electrodes CNE1 and CNE2 may be in contact with each of the electrodes 21 and 22 exposed through the opening OP.

The first insulating layer PAS1 may be formed to have a step such that a portion of the top surface thereof may be recessed between the first electrode 21 and the second electrode 22. For example, as the first insulating layer PAS1 may be disposed to cover the first electrode 21 and the second electrode 22, a step may be formed in the top surface thereof according to the shape of the electrodes 21 and 22 disposed therebelow. However, the disclosure is not limited thereto.

The bank BNL may be disposed on the first insulating layer PAS1. The bank BNL may include portions extending in the first direction DR1 and the second direction DR2 in plan view to be arranged in a grid pattern over the entire surface of the display area DPA. The bank BNL may be disposed along the boundaries between the sub-pixels SPXn to delimit the neighboring sub-pixels SPXn.

The bank BNL may also be arranged to surround the emission area EMA and the sub-region CBA disposed for each sub-pixel SPXn to delimit them from each other. The first electrode 21 and the second electrode 22 may extend in the second direction DR2 to be disposed across a portion of the bank BNL extending in the first direction DR1. In a portion extending in the second direction DR2 of the bank BNL, a portion disposed between the emission areas EMA may have a larger width than a portion disposed between the sub-regions CBA. Accordingly, the distance between the sub-regions CBA may be smaller than the distance between the emission areas EMA.

The bank BNL may be formed to have a height greater than that of the bank pattern BP. The bank BNL may prevent ink from overflowing to adjacent sub-pixels SPXn during the inkjet printing process of the manufacturing process of the display device 10, thereby separating inks in which different light emitting elements 30 may be dispersed for the corresponding sub-pixels SPXn such that the inks may not be mixed. The bank BNL may include polyimide (PI) similarly to the bank pattern BP, but is not limited thereto.

The light emitting element 30 may be disposed on the first insulating layer PAS1. The light emitting elements 30 may be disposed to be spaced apart from each other along the second direction DR2 in which the electrodes 21 and 22 extend, and may be aligned substantially parallel to each other. The light emitting element 30 may have a shape extending in a direction, and the extension direction of the light emitting element 30 may be substantially perpendicular to the extension direction of the electrodes 21 and 22. However, the disclosure is not limited thereto, and the light emitting element 30 may be disposed obliquely without being perpendicular to the extension direction of the electrodes 21 and 22.

The light emitting elements 30 disposed in each sub-pixel SPXn may include a light emitting layer ('36' in FIG. 7) including different materials to emit light of different wavelength bands to the outside. Accordingly, light of the first color, light of the second color, and light of the third color may be emitted from the first sub-pixel SPX1, the second sub-pixel SPX2, and the third sub-pixel SPX3, respectively. However, the disclosure is not limited thereto, and the sub-pixels SPXn may include the light emitting elements 30 of the same type to emit light of substantially the same color.

Between the bank patterns BP, the light emitting element 30 may have both ends respectively disposed above the electrodes 21 and 22. The extension length of the light emitting element 30 may be longer than the distance between the first electrode 21 and the second electrode 22, and both ends of the light emitting element 30 may be respectively disposed above the first electrode 21 and the second electrode 22. For example, the light emitting element 30 may be disposed such that an end may be placed above the first electrode 21 and another end may be placed above the second electrode 22.

The light emitting element 30 may be provided with layers disposed in a direction perpendicular to the top surface of the substrate 11 or the first planarization layer 19. The light emitting element 30 may be disposed such that an extension direction may be parallel to the top surface of the first planarization layer 19, and the semiconductor layers included in the light emitting element 30 may be sequentially arranged along a direction parallel to the top surface of the first planarization layer 19. However, the disclosure is not limited thereto, and in case that the light emitting element 30 has a different structure, the semiconductor layers may be disposed in a direction perpendicular to the top surface of the first planarization layer 19.

The ends of the light emitting element 30 may be in contact with respective connection electrodes CNE1 and CNE2. For example, in the light emitting element 30, a portion of semiconductor layers 31 and 32 (see FIG. 7) or an electrode layer 37 (see FIG. 7) may be exposed while an insulating layer 38 (see FIG. 7) may not be formed on the end surface on an extension direction side, and the semiconductor layers 31 and 32 (see FIG. 7) or the electrode layer 37 (see FIG. 7) that may be exposed may be in contact with the connection electrodes CNE1 and CNE2. However, the disclosure is not limited thereto, and at least a partial area of the insulating layer 38 may be removed from the light emitting element 30 to partially expose end side surfaces of the semiconductor layers 31 and 32 (see FIG. 7). The exposed side surface of the semiconductor layers 31 and 32 (see FIG. 7) may be in contact with the connection electrodes CNE1 and CNE2.

The second insulating layer PAS2 may be partially disposed on the light emitting element 30. For example, the second insulating layer PAS2 may have a width smaller than the length of the light emitting element 30 and be disposed on the light emitting element 30 to expose ends of the light emitting element 30 while surrounding the light emitting element 30. During the manufacturing process of the display device 10, the second insulating layer PAS2 may be disposed to cover the light emitting element 30, the electrodes 21 and 22, and the first insulating layer PAS1 and may be partially removed to expose ends of the light emitting element 30. The second insulating layer PAS2 may be disposed to extend in the second direction DR2 on the first insulating layer PAS1 in plan view, thereby forming a linear or island-like pattern in each sub-pixel SPXn. The second insulating layer PAS2 may protect the light emitting element 30 while fixing the light emitting element 30 during the manufacturing process of the display device 10.

The connection electrodes CNE1 and CNE2 and the third insulating layer PAS3 may be arranged on the second insulating layer PAS2.

The connection electrodes CNE1 and CNE2 may have a shape extending in a direction and may be disposed on each of the electrodes 21 and 22. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be disposed to be spaced apart from each other or to face each other. For example, the first connection electrode CNE1 and the second connection electrode CNE2 may be disposed on the first electrode 21 and the second electrode 22, respectively, so as to be spaced apart from each other in the first direction DR1. Each of the connection electrodes CNE1 and CNE2 may form a stripe pattern in the emission area EMA of each sub-pixel SPXn.

The connection electrodes CNE1 and CNE2 may each be in contact with the light emitting element 30. The first connection electrode CNE1 may be in contact with an end of the light emitting element 30, and the second connection electrode CNE2 may be in contact with another end of the light emitting element 30. The semiconductor layer of the light emitting element 30 may be exposed on both end surfaces of the light emitting element 30 in an extension direction, and each of the connection electrodes CNE1 and CNE2 may be in contact with the semiconductor layer of the light emitting element 30 to be electrically connected thereto. A side of each of the connection electrodes CNE1 and CNE2 that may be in contact with either end of the light emitting element 30 may be disposed on the second insulating layer PAS2. The first connection electrode CNE1 may be in contact with the first electrode 21 through the opening OP exposing a portion of the top surface of the first electrode 21, and the second connection electrode CNE2 may be in contact with the second electrode 22 through the opening OP exposing a portion of the top surface of the second electrode 22.

Each of the connection electrodes CNE1 and CNE2 may have a width measured in a direction less than a width measured in the direction of each of the electrodes 21 and 22. The connection electrodes CNE1 and CNE2 may be disposed not only to contact an end and another end of the light emitting element 30, respectively, but also to cover a portion of the top surface of the first electrode 21 and a portion of the top surface of the second electrode 22, respectively. However, the disclosure is not limited thereto, and the connection electrodes CNE1 and CNE2 may have a width greater than the width of the electrodes 21 and 22 to cover sides of the electrodes 21 and 22.

The connection electrodes CNE1 and CNE2 may include a transparent conductive material. For example, they may include ITO, IZO, ITZO, aluminum (Al), or the like, or a combination thereof. The light emitted from the light emitting element 30 may pass through the connection electrodes CNE1 and CNE2 and travel toward the electrodes 21 and 22. However, the disclosure is not limited thereto.

In the drawing, two connection electrodes CNE1 and CNE2 are disposed in one sub-pixel SPXn, but the disclosure is not limited thereto. The number of the connection electrodes CNE1 and CNE2 may vary depending on the number of the electrodes 21 and 22 disposed for each sub-pixel SPXn.

The third insulating layer PAS3 may be disposed to cover the first connection electrode CNE1. The third insulating layer PAS3 may be disposed to cover a side on which the first connection electrode CNE1 may be disposed with respect to the second insulating layer PAS2, including the first connection electrode CNE1. For example, the third insulating layer PAS3 may be disposed to cover the first connection electrode CNE1 and the first insulating layers PAS1 disposed on the first electrode 21. This disposition may be formed by a process of disposing the insulating material layer constituting the third insulating layer PAS3 entirely in the emission area EMA, and partially removing the insulating material layer to form the second connection electrode CNE2. In the above process, the insulating material layer constituting the third insulating layer PAS3 may be removed together with the insulating material layer constituting the second insulating layer PAS2, and a side of the third insulating layer PAS3 may be aligned with a side of the second insulating layer PAS2. A side of the second connection electrode CNE2 may be disposed on the third insulating layer PAS3 and may be insulated from the first connection electrode CNE1 with the third insulating layer PAS3 interposed therebetween.

A fourth insulating layer PAS4 may be entirely disposed in the display area DPA of the substrate 11. The fourth insulating layer PAS4 may function to protect members disposed on the substrate 11 from an external environment. However, the fourth insulating layer PAS4 may be omitted.

Each of the first insulating layer PAS1, the second insulating layer PAS2, the third insulating layer PAS3, and the fourth insulating layer PAS4 described above may include an inorganic insulating material or an organic insulating material. For example, the first insulating layer PAS1, the second insulating layer PAS2, the third insulating layer PAS3, and the fourth insulating layer PAS4 may include an inorganic insulating material such as silicon oxide (SiOx), silicon nitride (SiNx), silicon oxynitride (SiOxNy), aluminum oxide (AlxOy), and aluminum nitride (AlN), or a combination thereof. In other embodiments, they may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and the like, or a combination thereof. However, the disclosure is not limited thereto.

Figure 7:
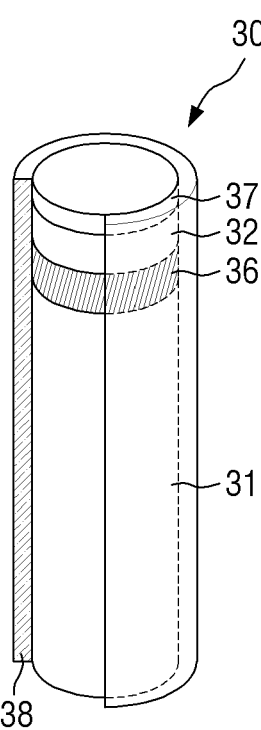
FIG. 7 is a schematic perspective view of a light emitting element according to an embodiment.

FIG. 7 is a schematic perspective view of a light emitting element according to an embodiment.

Referring to FIG. 7, the light emitting element 30 which may be a particulate element may have a rod or cylindrical shape having an aspect ratio. The light emitting element 30 may have a size of a nanometer scale (equal to or greater than 1 nm and less than 1 μm) to a micrometer scale (equal to or greater than 1 μm and less than 1 mm). In an embodiment, both the diameter and the length of the light emitting element 30 may be on a nanometer scale, or on a micrometer scale. In some other embodiments, the diameter of the light emitting element 30 may be on a nanometer scale, while the length of the light emitting element 30 may be on a micrometer scale. In some embodiments, some of the light emitting elements 30 may have a diameter and/or length on a nanometer scale, while some others of the light emitting elements 30 may have a diameter and/or length on a micrometer scale.

In an embodiment, the light emitting element 30 may be an inorganic light emitting diode. Specifically, the light emitting element 30 may include a semiconductor layer doped with any conductivity type (e.g., p-type or n-type) impurities. The semiconductor layer may emit light of a specific wavelength band by receiving an electrical signal applied from an external power source.

The light emitting element 30 according to an embodiment may include a first semiconductor layer 31, an active layer 33, a second semiconductor layer 32, and an electrode layer 37 sequentially stacked in a longitudinal direction. The light emitting element may further include an insulating layer 38 covering the outer surfaces of the first semiconductor layer 31, the second semiconductor layer 32, and the active layer 33.

The first semiconductor layer 31 may be an n-type semiconductor. In case that the light emitting element 30 emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be at least one or more of n-type doped AlGaInN, GaN, AlGaN, InGaN, AlN and InN. The first semiconductor layer 31 may be doped with an n-type dopant, and the n-type dopant may be Si, Ge, Sn, or the like, or a combination thereof. For example, the first semiconductor layer 31 may be n-GaN doped with n-type Si. The length of the first semiconductor layer 31 may have a range of 1.5 mm to 5 mm, but is not limited thereto.

The second semiconductor layer 32 may be disposed on a light emitting layer 36 to be described later. The second semiconductor layer 32 may be a p-type semiconductor. In case that the light emitting element 30 emits light of a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be at least one or more of p-type doped AlGaInN, GaN, AlGaN, InGaN, AlN and InN. The second semiconductor layer 32 may be doped with a p-type dopant, and the p-type dopant may be Mg, Zn, Ca, Se, Ba, or the like, or a combination thereof. For example, the second semiconductor layer 32 may be p-GaN doped with p-type Mg. The length of the second semiconductor layer 32 may have a range of 0.05 mm to 0.10 mm, but is not limited thereto.

Although it is illustrated in the drawing that the first semiconductor layer 31 and the second semiconductor layer 32 are configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately on each other. The light emitting layer 36 may emit light by coupling of electron-hole pairs according to an electrical signal applied through the first semiconductor layer 31 and the second semiconductor layer 32. In case that the light emitting layer 36 emits light of a blue wavelength band, a material such as AlGaN or AlGaInN may be included. In particular, in case that the light emitting layer 36 has a multiple quantum well structure in which quantum layers and well layers are alternately stacked on each other, the quantum layer may include a material such as AlGaN or AlGaInN, and the well layer may include a material such as GaN or AlInN. For example, as described above, the light emitting layer 36 may include AlGaInN as a quantum layer and AlInN as a well layer, and the light emitting layer 36 may emit blue light having a central wavelength band of 450 nm to 495 nm.

However, the disclosure is not limited thereto, and the light emitting layer 36 may have a structure in which semiconductor materials having large band gap energy and semiconductor materials having small band gap energy may be alternately stacked on each other, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases. The length of the light emitting layer 36 may have a range of 0.05 mm to 0.10 mm, but is not limited thereto.

Light emitted from the light emitting layer 36 may be emitted to side surfaces as well as the outer surface of the light emitting element 30 in a longitudinal direction. The directionality of light emitted from the light emitting layer 36 is not limited to one direction.

The electrode layer 37 may be an ohmic connection electrode. However, the disclosure is not limited thereto, and it may be a Schottky connection electrode. The light emitting element 30 may include at least one electrode layer 37. Although FIG. 7 illustrates that the light emitting element 30 includes one electrode layer 37, the disclosure is not limited thereto. In some cases, the light emitting element 30 may include a larger number of electrode layers 37 or none. The following description of the light emitting element 30 may be equally applied even if the number of electrode layers 37 is different or other structures are further included.

In the display device 10 according to an embodiment, in case that the light emitting element 30 is electrically connected to an electrode or a connection electrode, the electrode layer 37 may reduce the resistance between the light emitting element 30 and the electrode or connection electrode. The electrode layer 37 may include a conductive metal. For example, the electrode layer 37 may include at least one of aluminum (Al), titanium (T1), indium (In), gold (Au), silver (Ag), indium tin oxide (ITO), indium zinc oxide (IZO), and indium tin zinc oxide (ITZO). Further, the electrode layer 37 may include an n-type or p-type doped semiconductor material. The electrode layer 37 may include the same material or different materials, but is not limited thereto.

The insulating film 38 may be arranged to surround the outer surfaces of the semiconductor layers and electrode layers described above. For example, the insulating layer 38 may be disposed to surround at least the outer surface of the light emitting layer 36, and may extend in a direction in which the light emitting element 30 extends. The insulating film 38 may function to protect the members. The insulating layer 38 may be formed to surround side surfaces of the members to expose both ends of the light emitting element 30 in the longitudinal direction.

Although it is illustrated in the drawing that the insulating film 38 extends in the longitudinal direction of the light emitting element 30 to cover the side surface of the light emitting element 30 ranging from the first semiconductor layer 31 to the electrode layer 37, the disclosure is not limited thereto. The insulating film 38 may include the light emitting layer 36 to cover only the outer surfaces of some semiconductor layers, or may cover only a portion of the outer surface of the electrode layer 37 to partially expose the outer surface of each electrode layer 37. Further, in cross-sectional view, the insulating film 38 may have a top surface, which may be rounded in a region adjacent to at least one end of the light emitting element 30.

The thickness of the insulating film 38 may have a range of 10 nm to 1.0 mm, but is not limited thereto. In an embodiment, the thickness of the insulating film 38 may be around 40 nm.

The insulating film 38 may include materials having insulating properties, for example, silicon oxide (SiOx), silicon nitride (SiNx), silicon oxynitride (SiOxNy), aluminum nitride (AlN), aluminum oxide (AlxOy), and the like, or a combination thereof. Accordingly, it may be possible to prevent an electrical short circuit that may occur in case that the light emitting layer 36 may be in direct contact with the electrode through which the electrical signal may be transmitted to the light emitting element 30. Since the insulating film 38 protects the outer surface of the light emitting element 30 including the light emitting layer 36, it may be possible to prevent degradation in luminous efficiency.

Further, the insulating film 38 may have an outer surface which may be surface-treated. The light emitting elements 30 may be injected onto the electrode in a state of being dispersed in an ink to be aligned. Here, the surface of the insulating film 38 may be treated to have hydrophobic property or hydrophilic property in order to keep the light emitting elements 30 in the dispersed state without being aggregated with other adjacent light emitting elements 30 in the ink. For example, the insulating film 38 may be surface-treated on the outer surface thereof with a material such as stearic acid and 2,3-naphthalene dicarboxylic acid.

The display device 10 according to an embodiment described above may include the first voltage line VDL, the second voltage line VSL, a first data line, a second data line, a third data line, the initialization voltage line VIL, and the like that may be connected to each pixel PX. Each of these may extend in the non-display area NDA and may be connected to the driving integrated circuit. Among them, the first voltage line VDL may be joined to the first voltage common line, and the second voltage line VSL may be joined to the second voltage common line. The first voltage common line and the second voltage common line may be connected to the driving integrated circuit in a pad portion to receive a first voltage signal and a second voltage signal.

Figure 8:
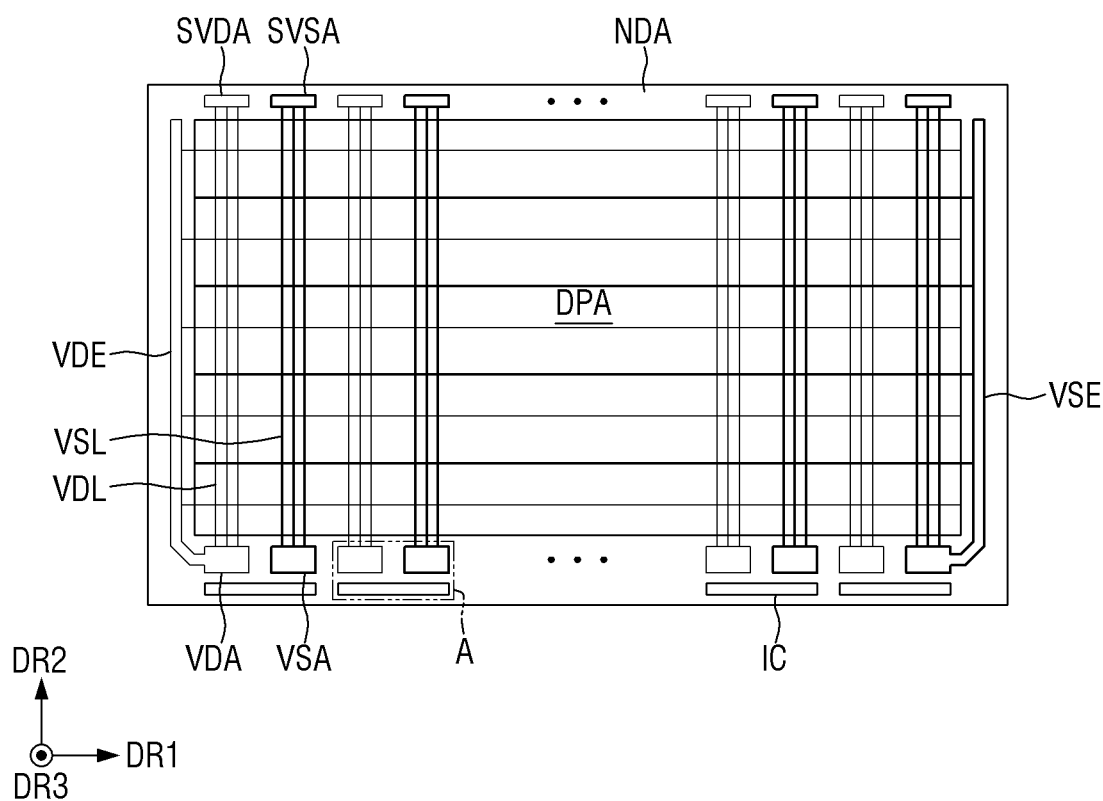
FIG. 8 is a plan view schematically illustrating a display device according to an embodiment.
Figure 9:
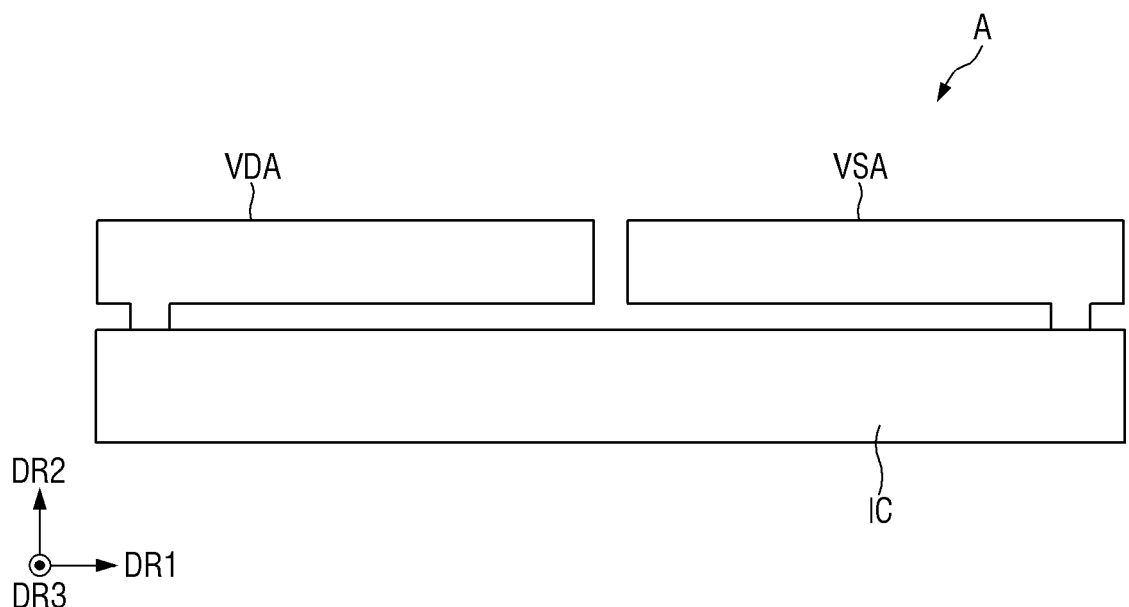
FIG. 9 is an enlarged schematic plan view of area A of FIG. 8.

FIG. 8 is a plan view schematically illustrating a display device according to an embodiment. FIG. 9 is an enlarged schematic plan view of area A of FIG. 8.

Referring to FIGS. 8 and 9, the display device 10 may include the non-display area NDA surrounding the display area DPA, and wires and voltage patterns may be disposed in the non-display area NDA.

In the display device 10, the first voltage line VDL, the second voltage line VSL, the initialization voltage line VIL, the first data line, the second data line, and the third data line may be disposed to extend from the display area DPA to the non-display area NDA. These may be wires extending from the pixels in the display area DPA to the non-display area NDA.

Driving integrated circuits IC may be disposed in the non-display area NDA. The driving integrated circuits IC may transmit signals applied from the outside to the wires. The number of driving integrated circuits IC disposed in the non-display area NDA may be variously adjusted according to the resolution of the display device 10.

The first voltage common line VDA and the second voltage common line VSA may be disposed in the non-display area NDA located in a direction opposite to the second direction DR2 from the display area DPA. The first voltage common line VDA may be disposed at a side of the driving integrated circuit IC and the second voltage common line VSA may be disposed at another side of the driving integrated circuit IC. For example, the first voltage common line VDA may be disposed at the left side of the driving integrated circuit IC and the second voltage common line VSA may be disposed at the right side of the driving integrated circuit IC. The first voltage common line VDA and the second voltage common line VSA may be alternately arranged to be spaced apart from each other in the first direction DR1. A DC voltage may be applied respectively to the first voltage common lines VDA and the second voltage common lines VSA, which may be alternately arranged, so that static electricity or noise signals that can be applied from the outside may be blocked or reduced in the non-display area NDA.

A first voltage auxiliary common line SVDA and a second voltage auxiliary common line SVSA may be disposed in the non-display area NDA located in the second direction DR2 from the display area DPA. The first voltage auxiliary common line SVDA and the second voltage auxiliary common line SVSA may be repeatedly arranged to be spaced apart from each other in the first direction DR1. The first voltage auxiliary common line SVDA and the first voltage common line VDA may be disposed to correspond to each other, and the second voltage auxiliary common line SVSA and the second voltage common line VSA may be disposed to correspond to each other. A DC voltage may be applied to the first voltage auxiliary common line SVDA and the second voltage auxiliary common line SVSA, respectively, so that static electricity or noise signals that can be applied from the outside may be blocked or reduced in the non-display area NDA.

The first voltage line VDL may be connected to the first voltage common line VDA and the first voltage auxiliary common line SVDA to receive the first voltage signal from the driving integrated circuit IC. For example, the first voltage line VDL may extend from the first voltage common line VDA in the second direction DR2 and pass through the display area DPA to extend to the first voltage auxiliary common line SVDA. The second voltage line VSL may be connected to the second voltage common line VSA to receive the second voltage signal from the driving integrated circuit IC. For example, the second voltage line VSL may extend from the second voltage common line VSA in the second direction DR2 and pass through the display area DPA to extend to the second voltage auxiliary common line SVSA.

A first voltage extension line VDE and a second voltage extension line VSE may be disposed in the non-display area NDA of the display device 10. The first voltage extension line VDE may be disposed to the left side of the display area DPA. The first voltage extension line VDE may connect the first voltage common line VDA to the first voltage auxiliary common line SVDA in the non-display area NDA. The second voltage extension line VSE may be disposed to the right side of the display area DPA. The second voltage extension line VSE may connect the second voltage common line VSA to the second voltage auxiliary common line SVSA in the non-display area NDA. A DC voltage may be applied to the first voltage extension line VDE and the second voltage extension line VSE, respectively, so that static electricity or noise signals that can be applied from the outside may be blocked or reduced in the non-display area NDA.

As shown in FIG. 9, the first voltage common line VDA and the second voltage common line VSA may each be connected to a driving integrated circuit IC. The first voltage common line VDA may be connected to the left side of the driving integrated circuit IC, and the second voltage common line VSA may be connected to the right side of the driving integrated circuit IC.

The driving integrated circuit IC may apply the first voltage signal through a region adjacent to a side of the first voltage common line VDA and may apply the second voltage signal through a region adjacent to a side of the second voltage common line VSA. The first voltage signal applied to the first voltage common line VDA or the second voltage signal applied to the second voltage common line VSA may be difficult to be uniformly applied to the entire line.

Hereinafter, in an embodiment, the display device 10 in which uniform voltage signals may be applied throughout the first voltage common line VDA and the second voltage common line VSA will be described.

Figure 10:
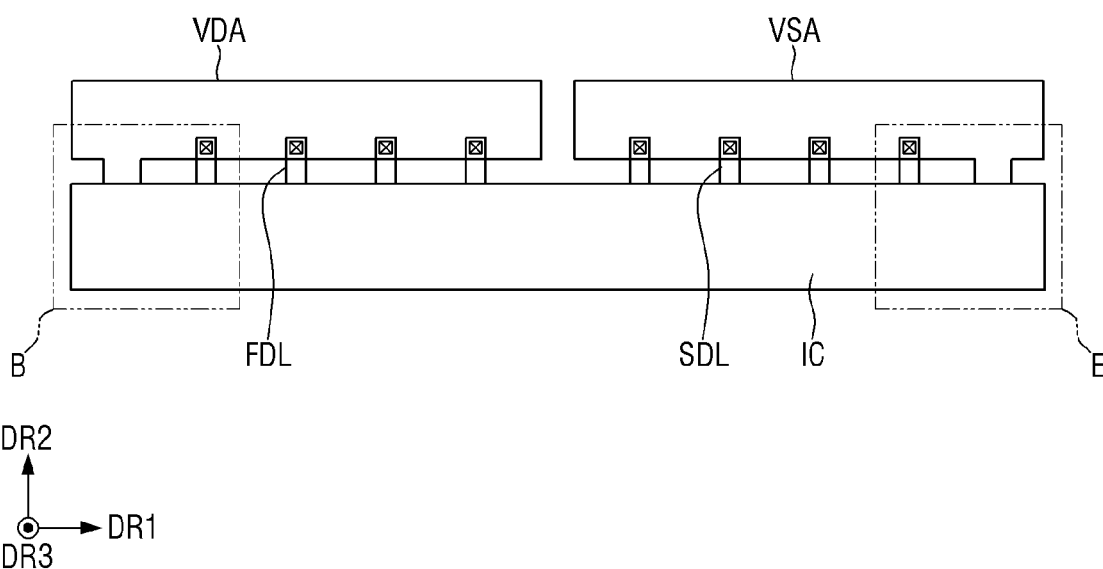
FIG. 10 is a schematic plan view illustrating a portion of a non-display area in a display device according to an embodiment.
Figure 11:
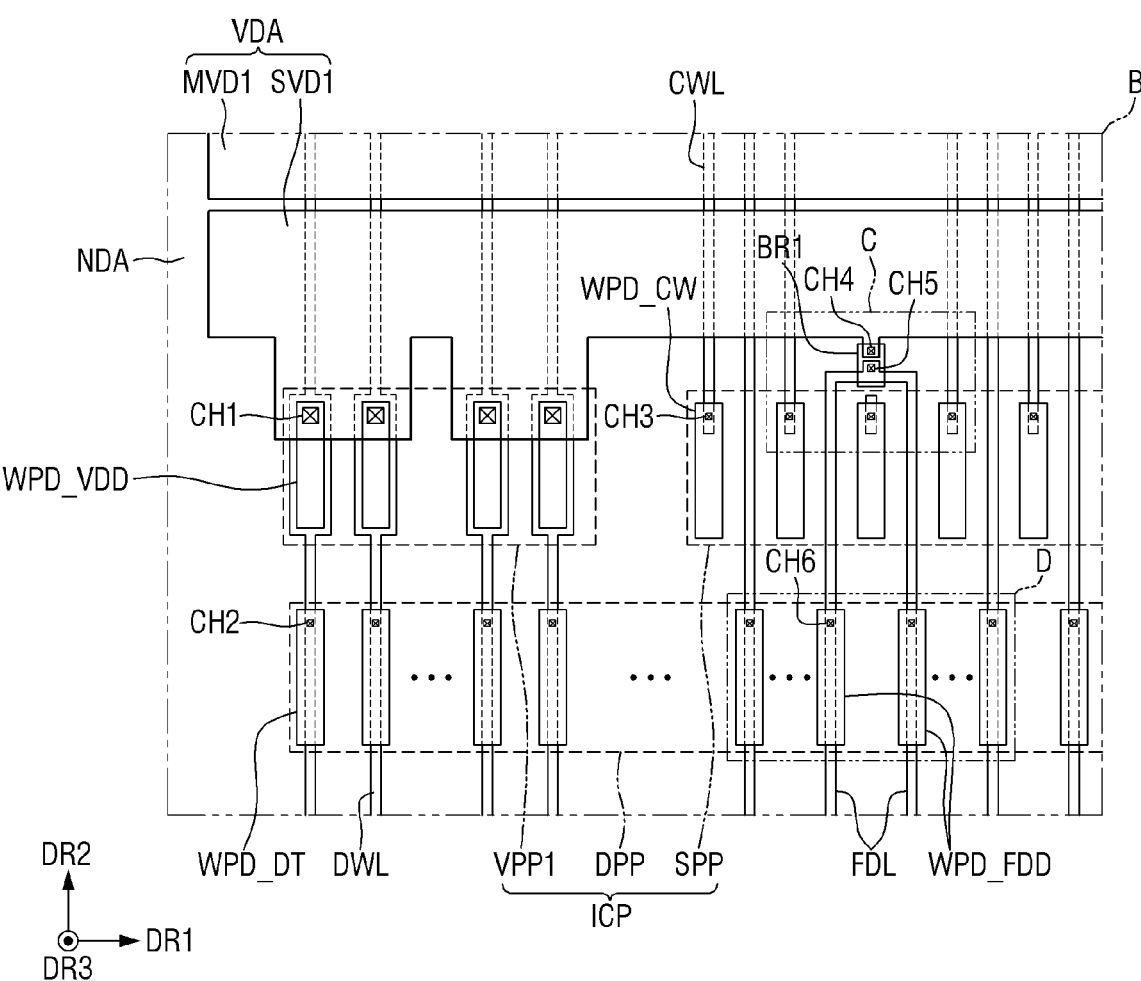
FIG. 11 is an enlarged schematic plan view of area B of FIG. 10.
Figure 12:
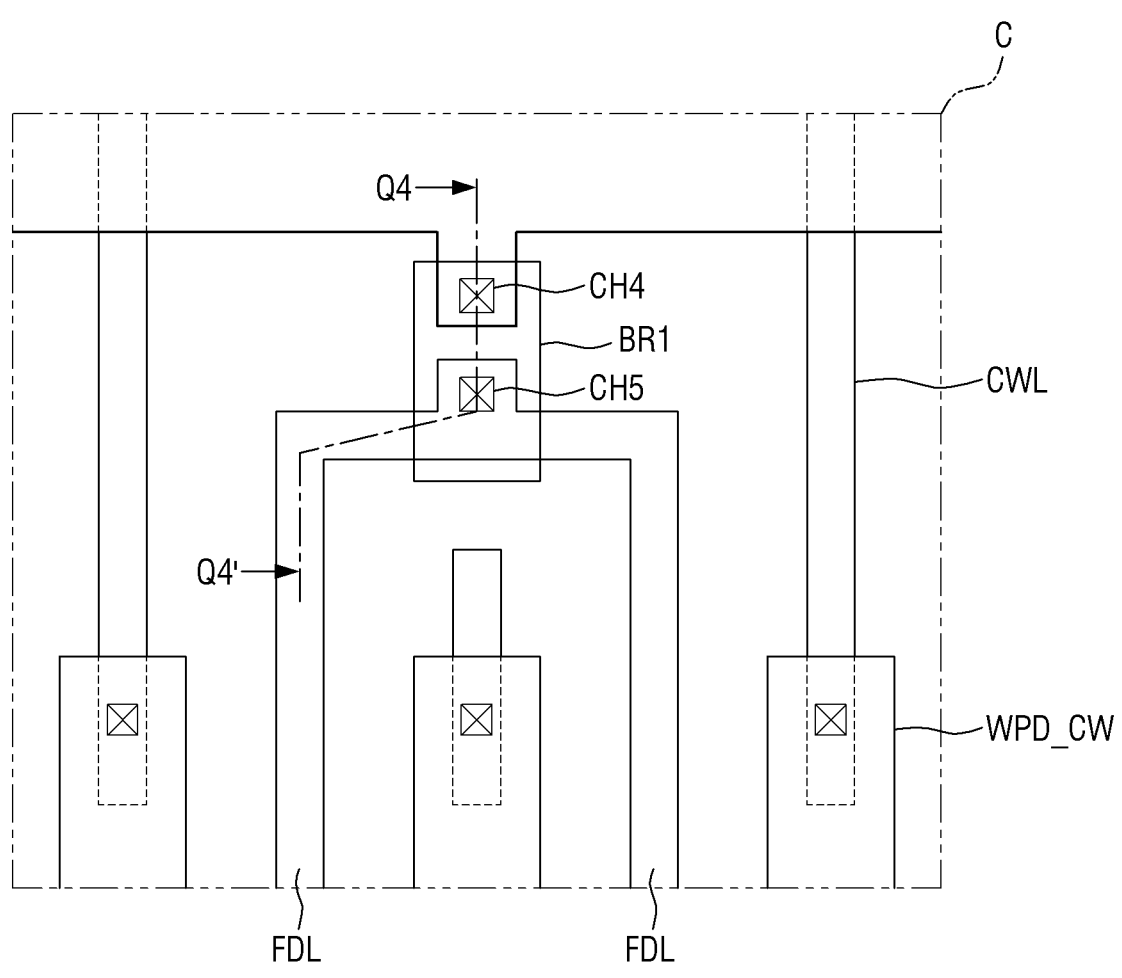
FIG. 12 is an enlarged schematic plan view of area C of FIG. 11.
Figure 13:
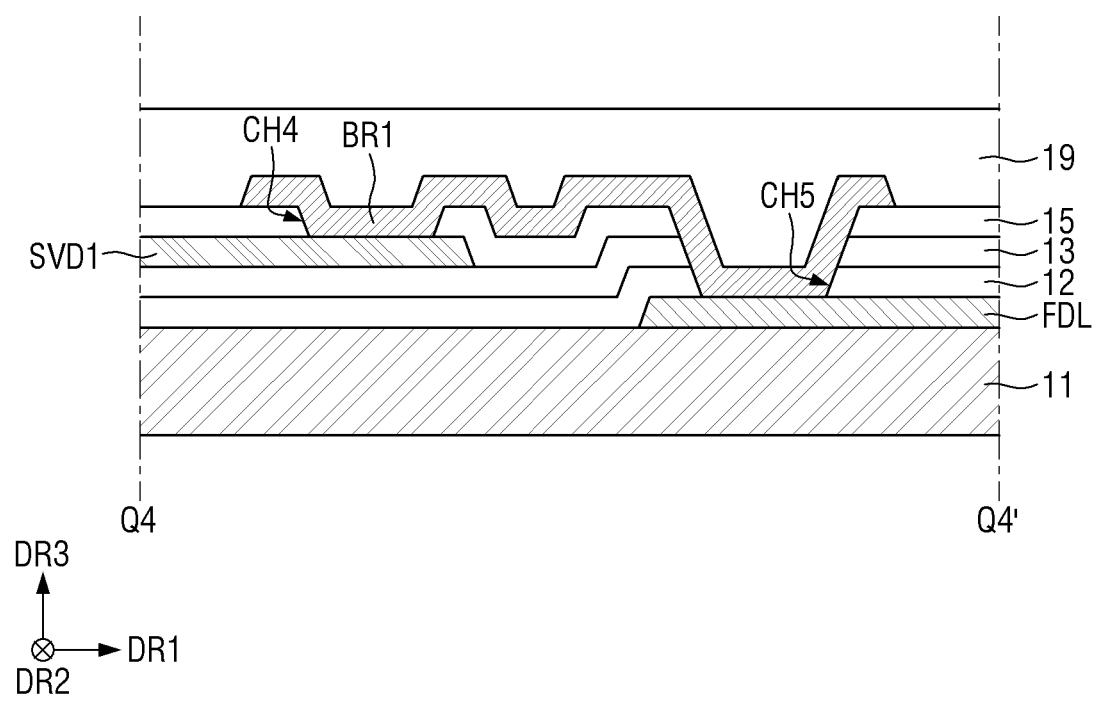
FIG. 13 is a schematic cross-sectional view taken along line Q4-Q4' of FIG. 12.
Figure 14:
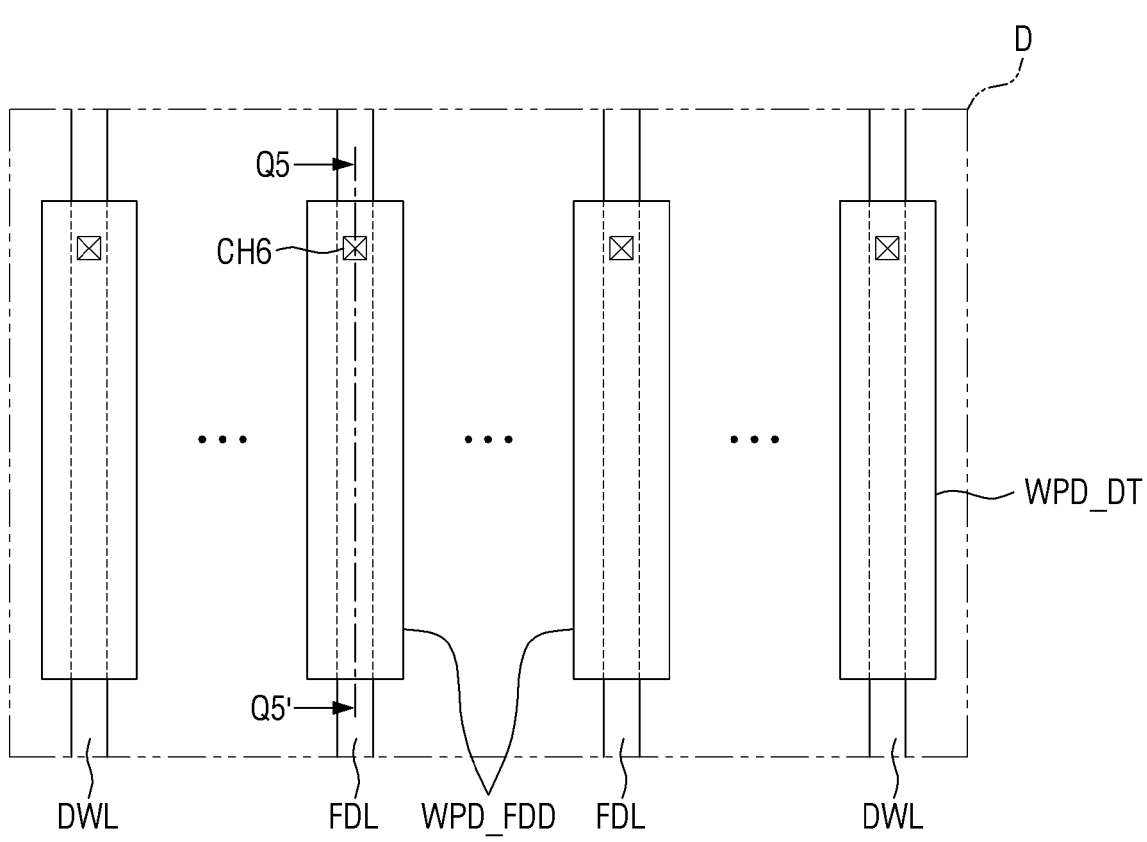
FIG. 14 is an enlarged plan view of area D of FIG. 11.
Figure 15:
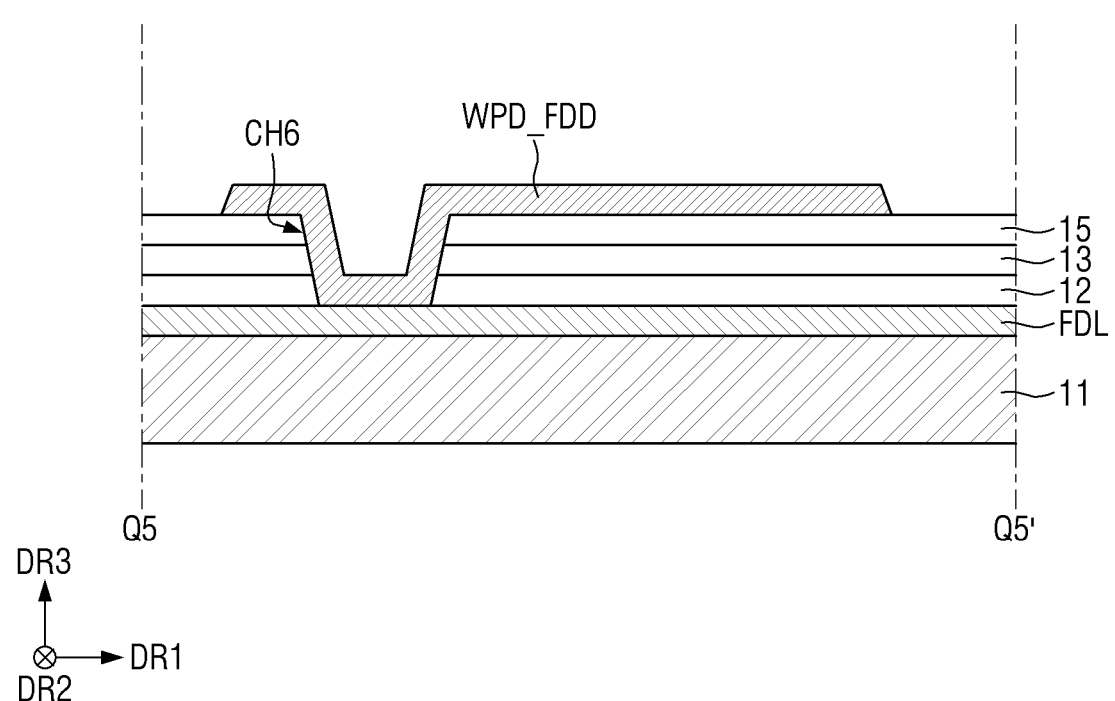
FIG. 15 is a schematic cross-sectional view taken along line Q5-Q5' of FIG. 14.
Figure 16:
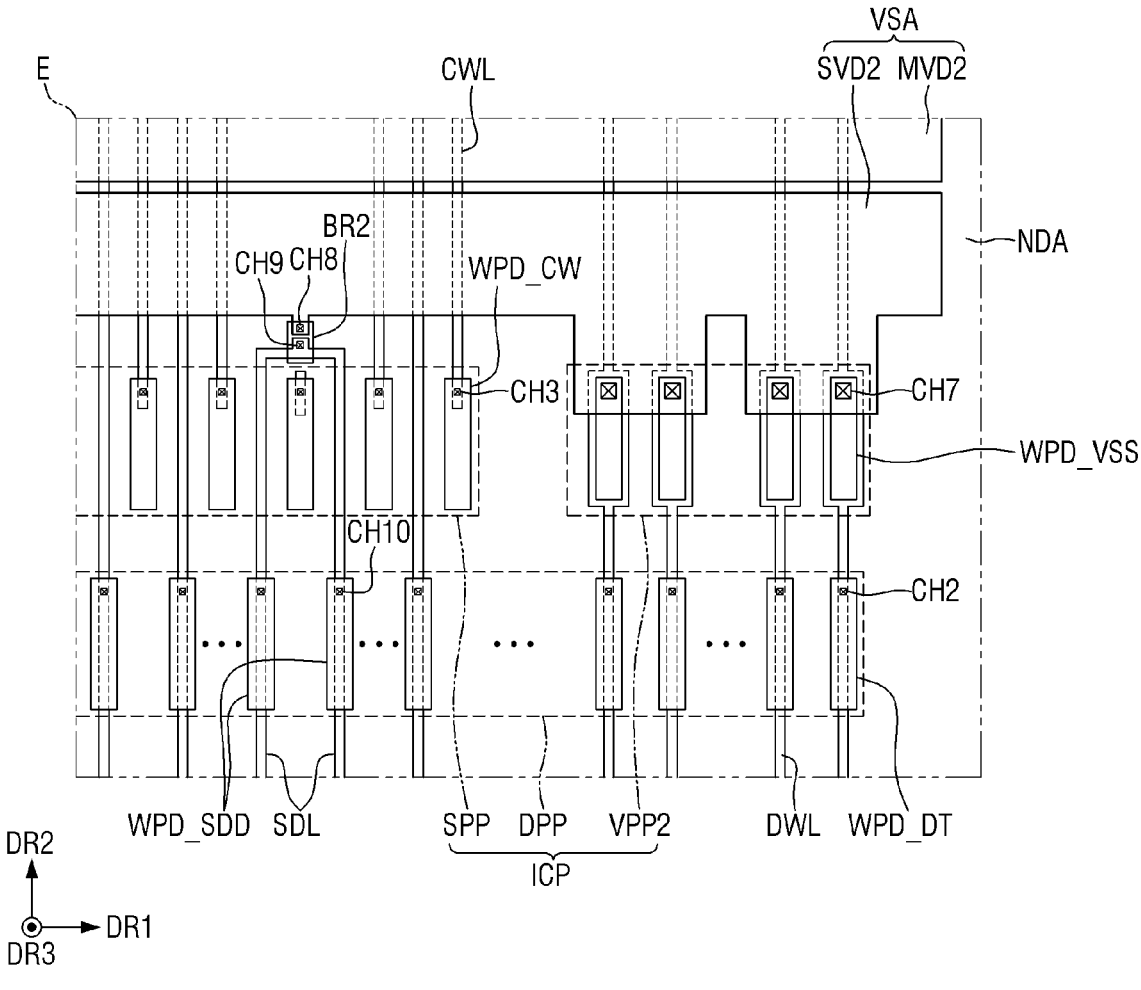
FIG. 16 is an enlarged schematic plan view of area E of FIG. 10.

FIG. 10 is a schematic plan view illustrating a portion of a non-display area in a display device according to an embodiment. FIG. 11 is an enlarged schematic plan view of area B of FIG. 10. FIG. 12 is an enlarged schematic plan view of area C of FIG. 11. FIG. 13 is a schematic cross-sectional view taken along line Q4-Q4' of FIG. 12. FIG. 14 is an enlarged schematic plan view of area D of FIG. 11. FIG. 15 is a schematic cross-sectional view taken along line Q5-Q5' of FIG. 14. FIG. 16 is an enlarged schematic plan view of area E of FIG. 10. For reference, FIG. 10 shows an area corresponding to area A of FIG. 8.

Referring to FIGS. 10 and 11, the driving integrated circuit IC may be disposed in the non-display area of the display device 10, and the first voltage common line VDA, the second voltage common line VSA, data routing lines DWL, and scan routing lines CWL may be connected to the driving integrated circuit IC. The first voltage common line VDA may be connected to the first voltage line VDL extending from the display area DPA, and the second voltage common line VSA may be connected to the second voltage line VSL extending from the display area DPA. The data routing lines DWL may be connected to the data lines DTL extending from the display area DPA, and the scan routing lines CWL may extend from the scan driver SDR. Hereinafter, a description will be made taking the first voltage common line VDA as an example.

Specifically, a pad portion ICP to which the driving integrated circuit IC may be attached may be disposed in the non-display area NDA. The pad portion ICP may include a first power pad portion VPP1 connected to the first voltage common line VDA, a scan pad portion SPP connected to the scan routing lines CWL, and a data pad portion DPP connected to the data routing lines DWL.

The data pad portion DPP may be disposed at the outermost part and may be disposed to extend in the first direction DR1. The scan pad portion SPP and the first power pad portion VPP1 may be disposed between the display area DPA and the data pad portion DPP. The first power pad portion VPP1 may be disposed to the left side of the scan pad portion SPP.

The first voltage common line VDA may be disposed between the pad portion ICP and the display area DPA. The second voltage common line VSA may be disposed between the pad portion ICP and the display area DPA, and may be spaced apart from the first voltage common line VDA in the first direction DR1. The data pad portion DPP described above may be disposed to be opposite to the first voltage common line VDA and the second voltage common line VSA. The scan pad portion SPP may be disposed between the first voltage common line VDA and the data pad portion DPP, and between the second voltage common line VSA and the data pad portion DPP.

The first voltage common line VDA may include a first main portion MVD1 and a first sub-portion SVD1 connected to the first main portion MVD1. The first main portion MVD1 may be disposed adjacent to the display area DPA. The first sub-portion SVD1 may be disposed between the first main portion MVD1 and the pad portion ICP and may be connected to the driving integrated circuit IC in the pad portion ICP. The first main portion MVD1 may be disposed to be spaced apart from the first sub-portion SVD1 in the second direction DR2. The first main portion MVD1 and the first sub-portion SVD1 may be disposed on different layers to be connected to each other. For example, the first main portion MVD1 may be formed of the first data conductive layer, and the first sub-portion SVD1 may be formed of the first gate conductive layer. The first main portion MVD1 and the first sub-portion SVD1 may be directly connected through a contact hole.

The first sub-portion SVD1 of the first voltage common line VDA may partially extend to the pad portion ICP. In detail, the first sub-portion SVD1 may extend to the first power pad portion VPP1 to overlap the first power pad portion VPP1. A first power pad WPD_VDD may be disposed in the first power pad portion VPP1. The first sub-portion SVD1 may be directly connected to the first power pad WPD_VDD through a first contact hole CH1.

The data routing lines DWL may be disposed in the non-display area NDA and may extend to the pad portion ICP. The data routing lines DWL may extend in the second direction DR2 to overlap and cross the first voltage common line VDA. The data routing lines DWL may partially overlap the first power pad WPD_VDD and extend to the data pad portion DPP of the pad portion ICP. Data pads WPD_DT may be disposed in the data pad portion DPP to be spaced apart from each other in the first direction DR1. The data routing lines DWL may be directly connected to the data pads WPD_DT through a second contact hole CH2.

The scan routing lines CWL may be disposed in the non-display area NDA and may extend to the pad portion ICP. The scan routing lines CWL may extend in the second direction DR2 to overlap and cross the first voltage common line VDA. The scan routing lines CWL may extend to the scan pad portion SPP of the pad portion ICP. Scan pads WPD_CW may be disposed in the scan pad portion SPP to be spaced apart from each other in the first direction DR1. The scan routing lines CWL may be directly connected to the scan pad WPD_CW through a third contact hole CH3.

The data routing lines DWL and the scan routing lines CWL described above may be formed of the first lower conductive layer, which may be the same as the light blocking layer BML. The scan pads WPD_CW, the data pads WPD_DT, and the first power pads WPD_VDD may be formed of the first data conductive layer.

In an embodiment, the first voltage common line VDA may be connected to the driving integrated circuit IC through first auxiliary lines FDL in a region other than the first power pad portion VPP1.

Referring to FIGS. 11 to 15, the first auxiliary lines FDL may be disposed to extend in the second direction DR2 in the non-display area NDA. The first auxiliary lines FDL may be disposed adjacent to the first sub-portion SVD1 of the first voltage common line VDA while overlapping the pad portion ICP.

A first bridge layer BR1 may be disposed between the first sub-portion SVD1 of the first voltage common line VDA and the first auxiliary lines FDL. The first bridge layer BR1 may be disposed between the first sub-portion SVD1 and the scan pad portion SPP. A portion of the first bridge layer BR1 may overlap the first sub-portion SVD1 and another part thereof may overlap the first auxiliary lines FDL. The first bridge layer BR1 may be directly connected to the first sub-portion SVD1 through a fourth contact hole CH4 penetrating the first interlayer insulating layer 15 and exposing the first sub-portion SVD1. The first bridge layer BR1 may be directly connected to the first auxiliary line FDL through a fifth contact hole CH5 penetrating the buffer layer 12, the first gate insulating layer 13, and the first interlayer insulating layer 15 to expose the first auxiliary line FDL. Accordingly, the first sub-portion SVD1 and the first auxiliary line FDL may be electrically connected to each other through the first bridge layer BR1.

The first voltage common line VDA, the first auxiliary lines FDL, and the first bridge layers BR1 may be disposed on different layers. For example, the first auxiliary lines FDL may be disposed on the substrate 11, the first voltage common line VDA may be disposed on the first gate insulating layer 13, and the first bridge layers BR1 may be disposed on the first interlayer insulating layer 15. For example, the first voltage common line VDA may be disposed on the first auxiliary lines FDL and the first bridge layer BR1 may be disposed on the first voltage common line VDA.

The first auxiliary lines FDL may extend to overlap the scan pad portion SPP and the data pad portion DPP. First auxiliary pads WPD_FDD may be disposed in the data pad portion DPP to be spaced apart from the first power pad portion VPP1. The first auxiliary pads WPD_FDD connected to the first auxiliary lines FDL may be disposed between the data pads WPD_DT of the data pad portion DPP. The first auxiliary pads WPD_FDD may be disposed on the first interlayer insulating layer 15, and may be disposed on the same layer as the first bridge layer BR1. The first auxiliary pads WPD_FDD may be directly connected to the first auxiliary line FDL through a sixth contact hole CH6 penetrating the buffer layer 12, the first gate insulating layer 13, and the first interlayer insulating layer 15 to expose the first auxiliary line FDL. Accordingly, a first power signal applied through the first auxiliary pad WPD_FDD may be applied to the first voltage common line VDA through the first auxiliary lines FDL.

As shown in FIGS. 13 and 15, the first planarization layer 19 may be disposed in the non-display area NDA where the first bridge layer BR1 may be disposed, but the first planarization layer 19 may not be disposed in the data pad portion DPP. For example, since the first planarization layer 19 may not be disposed in the pad portion ICP, electrical connection between the driving integrated circuit IC and the pads may be well achieved due to the step caused by the first planarization layer 19.

As described above, the first voltage signal may be uniformly applied to the entire first voltage common line VDA through the first auxiliary lines FDL as well as a region adjacent to a side of the driving integrated circuit IC. Accordingly, since the first voltage signal may be uniformly applied to the entire first voltage common line VDA, the display quality of the display device 10 may be improved.

The second voltage signal may be uniformly applied to the entire second voltage common line VSA through a second auxiliary line SDL.

Referring to FIG. 16, a second power pad portion VPP2 may be disposed in the pad portion ICP to be spaced apart from the first power pad portion VPP1 in the first direction DR1 with the scan pad portion SPP interposed therebetween. The second power pad portion VPP2 may be a region in which the second voltage common line VSA may be connected to the driving integrated circuit IC.

The second voltage common line VSA may be disposed between the pad portion ICP and the display area DPA. The second voltage common line VSA may be disposed between the pad portion ICP and the display area DPA to be spaced apart from the first voltage common line VDA in the first direction DR1.

The second voltage common line VSA may include a second main portion MVD2 and a second sub-portion SVD2 connected to the second main portion MVD2. The second main portion MVD2 may be disposed adjacent to the display area DPA. The second sub-portion SVD2 may be disposed between the second main portion MVD2 and the pad portion ICP and may be connected to the driving integrated circuit IC in the pad portion ICP. The second main portion MVD2 may be disposed to be spaced apart from the second sub-portion SVD2 in the second direction DR2. The second main portion MVD2 and the second sub-portion SVD2 may be disposed on different layers to be connected to each other. For example, the second main portion MVD2 may be formed of the first data conductive layer, and the second sub-portion SVD2 may be formed of the first gate conductive layer. The second main portion MVD2 and the second sub-portion SVD2 may be directly connected to each other through a contact hole.

The second sub-portion SVD2 of the second voltage common line VSA may partially extend to the pad portion ICP. In detail, the second sub-portion SVD2 may extend to the second power pad portion VPP2 to overlap the second power pad portion VPP2. A second power pad WPD_VSS may be disposed in the second power pad portion VPP2. The second sub-portion SVD2 may be directly connected to the second power pad WPD_VSS through a seventh contact hole CH7.

The data routing lines DWL may extend in the second direction DR2 to overlap and cross the second voltage common line VSA. The data routing lines DWL may partially overlap the second power pad WPD_VSS and extend to the data pad portion DPP of the pad portion ICP. The scan routing lines CWL may extend in the second direction DR2 to overlap and cross the second voltage common line VSA. The second power pads WPD_VSS described above may be formed of the first data conductive layer.

In an embodiment, the second voltage common line VSA may be connected to the driving integrated circuit IC through the second auxiliary lines SDL in a region other than the second power pad VPP2.

The second auxiliary lines SDL may be disposed to extend in the second direction DR2 in the non-display area NDA. The second auxiliary lines SDL may be disposed adjacent to the second sub-portion SVD2 of the second voltage common line VSA while overlapping the pad portion ICP.

A second bridge layer BR2 may be disposed between the second sub-portion SVD2 of the second common voltage line VSA and the second auxiliary lines SDL. The second bridge layer BR2 may be disposed between the second sub-portion SVD2 and the scan pad portion SPP. A portion of the second bridge layer BR2 may overlap the second sub-portion SVD2 and another part thereof may overlap the second auxiliary lines SDL. The second bridge layer BR2 may be directly connected to the second sub-portion SVD2 through an eighth contact hole CH8 penetrating the first interlayer insulating layer 15 (see FIG. 13) to expose the second sub-portion SVD2. The second bridge layer BR2 may be directly connected to the second auxiliary line SDL through a ninth contact hole CH9 penetrating the buffer layer 12 (see FIG. 13), the first gate insulating layer 13 (see FIG. 13), and the first interlayer insulating layer 15 (see FIG. 13) to expose the second auxiliary line SDL. Accordingly, the second sub-portion SVD2 and the second auxiliary line SDL may be electrically connected to each other through the second bridge layer BR2.

The second voltage common line VSA, the second auxiliary lines SDL, and the second bridge layers BR2 may be disposed on different layers. For example, the second auxiliary lines SDL may be disposed on the substrate 11, the second voltage common line VSA may be disposed on the first gate insulating layer 13, and the second bridge layers BR2 may be disposed on the first interlayer insulating layer 15. For example, the second voltage common line VSA may be disposed on the second auxiliary lines SDL, and the second bridge layer BR2 may be disposed on the second voltage common line VSA.

The second auxiliary lines SDL may extend to overlap the scan pad portion SPP and the data pad portion DPP. Second auxiliary pads WPD_SDD may be disposed in the data pad portion DPP to be spaced apart from the second power pad portion VPP2. The second auxiliary pads WPD_SDD connected to the second auxiliary lines SDL may be disposed between the data pads WPD_DT of the data pad portion DPP. The second auxiliary pads WPD_SDD may be disposed on the first interlayer insulating layer 15 and may be disposed on the same layer as the second bridge layer BR2. The second auxiliary pads WPD_SDD may be directly connected to the second auxiliary line SDL through a tenth contact hole CH10 penetrating the buffer layer 12, the first gate insulating layer 13, and the first interlayer insulating layer 15 to expose the second auxiliary line SDL. Accordingly, a second power signal applied through the second auxiliary pad WPD_SDD may be applied to the second voltage common line VSA through the second auxiliary lines SDL.

As described above, the second voltage signal may be uniformly applied to the entire second voltage common line VDA through the second auxiliary lines SDL as well as a region adjacent to a side of the driving integrated circuit IC. Accordingly, since the second voltage signal may be uniformly applied to the entire second voltage common line VSA, the display quality of the display device 10 may be improved.

The first auxiliary pad WPD_FDD connecting the first auxiliary line FDL to the driving integrated circuit IC and/or the second auxiliary pad WPD_SDD connecting the second auxiliary line SDL to the driving integrated circuit IC may be disposed in the data pad portion DPP.

Figure 17:
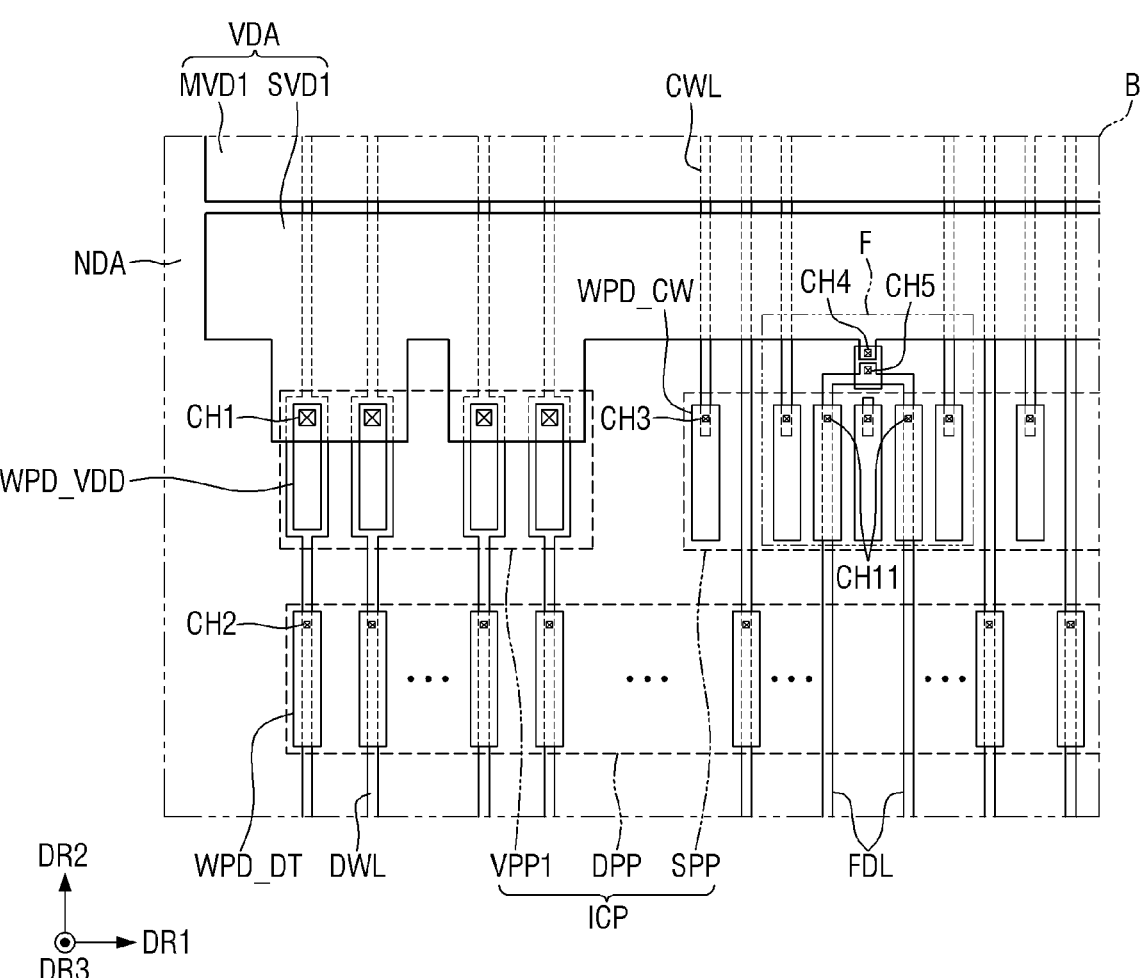
FIG. 17 is a schematic plan view illustrating a non-display area of a display device according to another embodiment.
Figure 18:
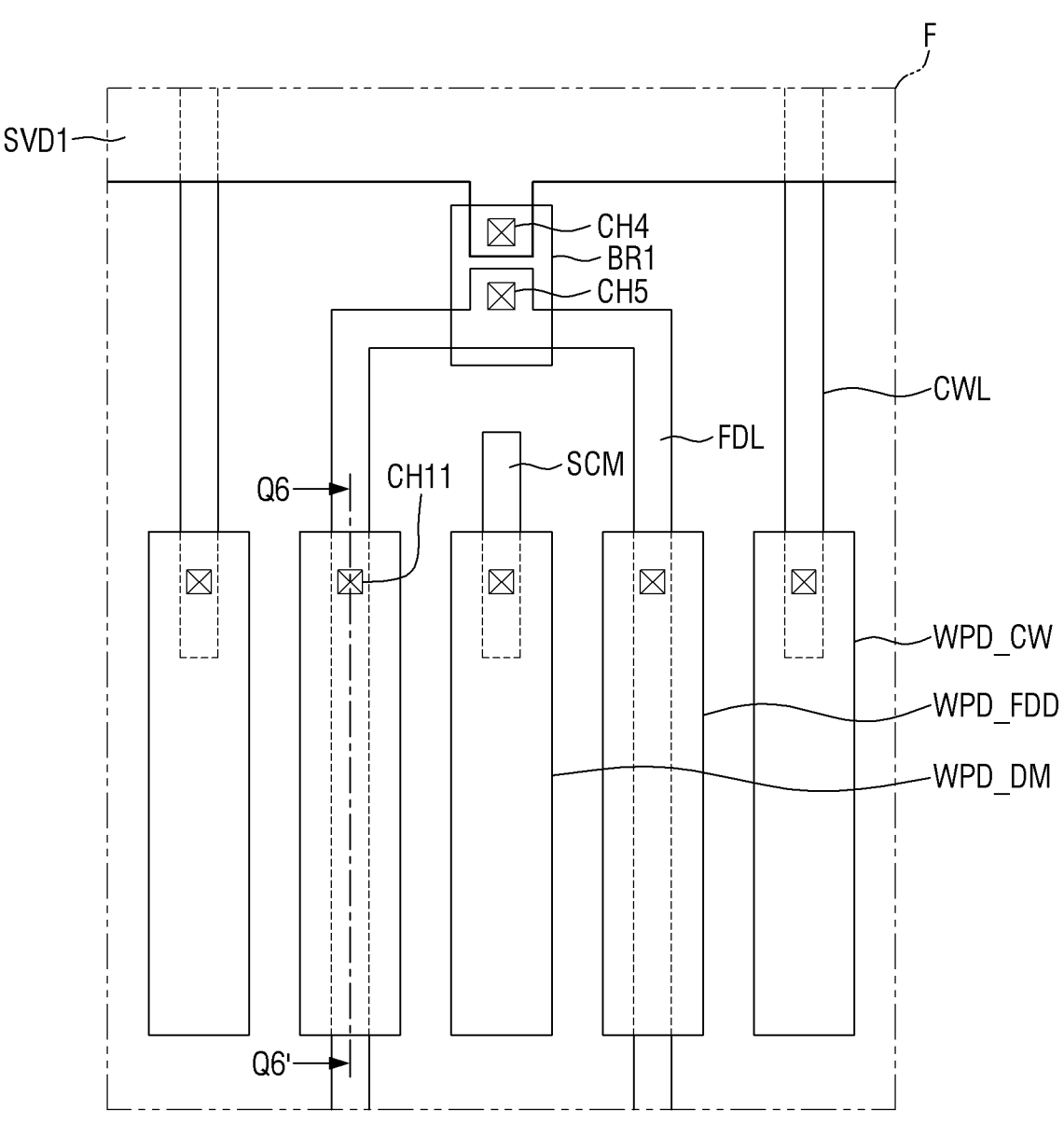
FIG. 18 is an enlarged schematic plan view of area F of FIG. 17.
Figure 19:
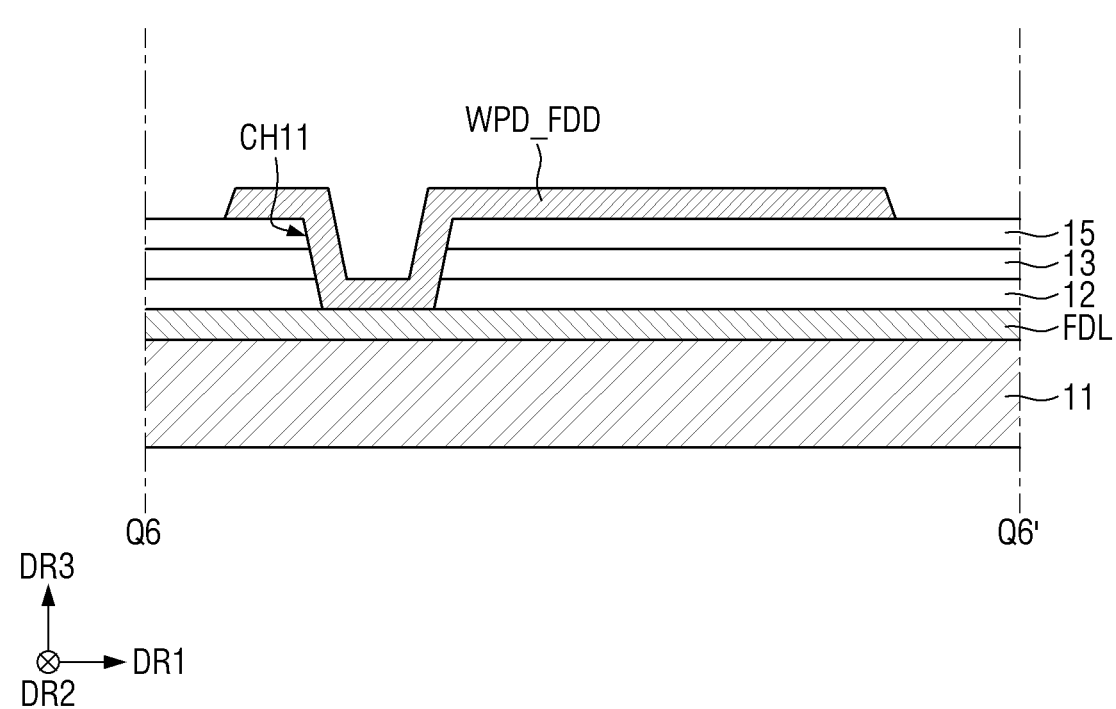
FIG. 19 is a schematic cross-sectional view taken along line Q6-Q6' of FIG. 18.

FIG. 17 is a schematic plan view illustrating a non-display area of a display device according to another embodiment. FIG. 18 is an enlarged schematic plan view of area F of FIG. 17. FIG. 19 is a schematic cross-sectional view taken along line Q6-Q6' of FIG. 18.

Referring to FIGS. 17 to 19, an embodiment may be different from the above-described embodiments at least in that the first auxiliary pad WPD_FDD and/or the second auxiliary pad WPD_SDD may be disposed in the scan pad portion SPP. In the following description, redundant description of the above-described embodiments will be omitted while focusing on differences. Since the arrangement of the second auxiliary pad WPD_SDD may be the same as that of the first auxiliary pad WPD_FDD, the description will be made taking the first auxiliary pad WPD_FDD as an example.

The first bridge layer BR1 may be disposed between the first sub-portion SVD1 of the first voltage common line VDA and the first auxiliary lines FDL. The first bridge layer BR1 may be disposed between the first sub-portion SVD1 and the scan pad portion SPP. A portion of the first bridge layer BR1 may overlap the first sub-portion SVD1 and another part thereof may overlap the first auxiliary lines FDL. The first bridge layer BR1 may be directly connected to the first sub-portion SVD1 through the fourth contact hole CH4 penetrating the first interlayer insulating layer 15 (see FIG. 13) to expose the first sub-portion SVD1. The first bridge layer BR1 may be directly connected to the first auxiliary line FDL through the fifth contact hole CH5 penetrating the buffer layer 12 (see FIG. 13), the first gate insulating layer 13 (see FIG. 13), and the first interlayer insulating layer 15 (see FIG. 13) to expose the first auxiliary line FDL. Accordingly, the first sub-portion SVD1 and the first auxiliary line FDL may be electrically connected to each other through the first bridge layer BR1.

The first auxiliary lines FDL may be disposed to extend in the second direction DR2 in the non-display area NDA. The first auxiliary lines FDL may be disposed adjacent to the first sub-portion SVD1 of the first voltage common line VDA while overlapping the pad portion ICP.

The first auxiliary lines FDL may extend to overlap the scan pad portion SPP and the data pad portion DPP. The first auxiliary pads WPD_FDD may be disposed in the scan pad portion SPP. The first auxiliary pads WPD_FDD connected to the first auxiliary lines FDL may be disposed between the scan pads WPD_CW of the scan pad portion SPP. The first auxiliary pads WPD_FDD may be directly connected to the first auxiliary line FDL through an eleventh contact hole CH11 penetrating the buffer layer 12, the first gate insulating layer 13, and the first interlayer insulating layer 15 to expose the first auxiliary line FDL. Accordingly, the first power signal applied through the first auxiliary pad WPD_FDD may be applied to the first voltage common line VDA through the first auxiliary lines FDL.

A scan dummy line SCM and a scan dummy pad WPD_DM may be disposed between the first auxiliary lines FDL and between the first auxiliary pads WPD_FDD. Since the scan dummy line SCM may be difficult to extend to the display area DPA due to the first auxiliary lines FDL, it may be floating state and act as a dummy. Similarly, the scan dummy pad WPD_DM connected to the scan dummy line SCM may also act as a dummy pad. A scan signal may be applied from the driving integrated circuit IC to the scan dummy line SCM and the scan dummy pad WPD_DM, but the scan signal may not be transmitted therethrough due to the floating scan dummy line SCM.

The first planarization layer 19 may not be disposed in the scan pad portion SPP. For example, since the first planarization layer 19 may not be disposed in the pad portion ICP, electrical connection between the driving integrated circuit IC and the scan pad WPD_CW, and between the driving integrated circuit IC and the first auxiliary pad WPD_FDD may be well established due to the step caused by the first planarization layer 19.

Although not shown, the second auxiliary pads WPD_SDD may also be disposed in the scan pad portion SPP, and the scan dummy line SCM and the scan dummy pad WPD_DM may be disposed between the second auxiliary lines SDL.

As described above, the first auxiliary pad WPD_FDD may be disposed in the scan pad portion SPP, so that the first voltage signal may be uniformly applied to the entire first voltage common line VDA through the first auxiliary lines FDL. Accordingly, since the first voltage signal may be uniformly applied throughout the first voltage common line VDA, the display quality of the display device 10 may be improved.

Figure 20:
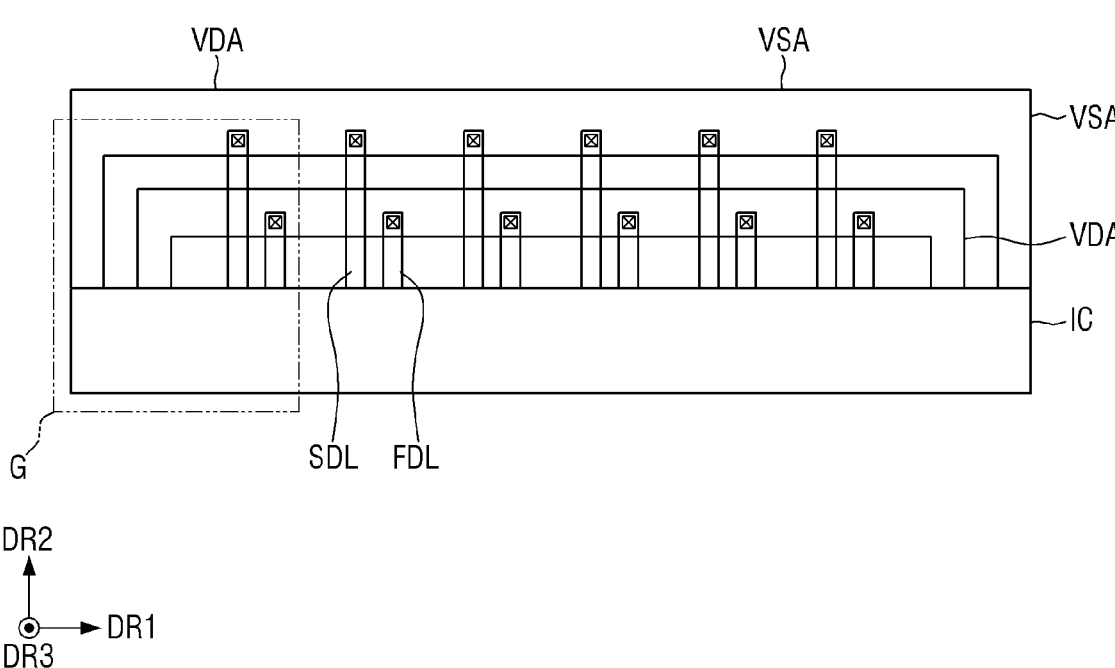
FIG. 20 is a schematic plan view illustrating a non-display area of a display device according to still another embodiment.
Figure 21:
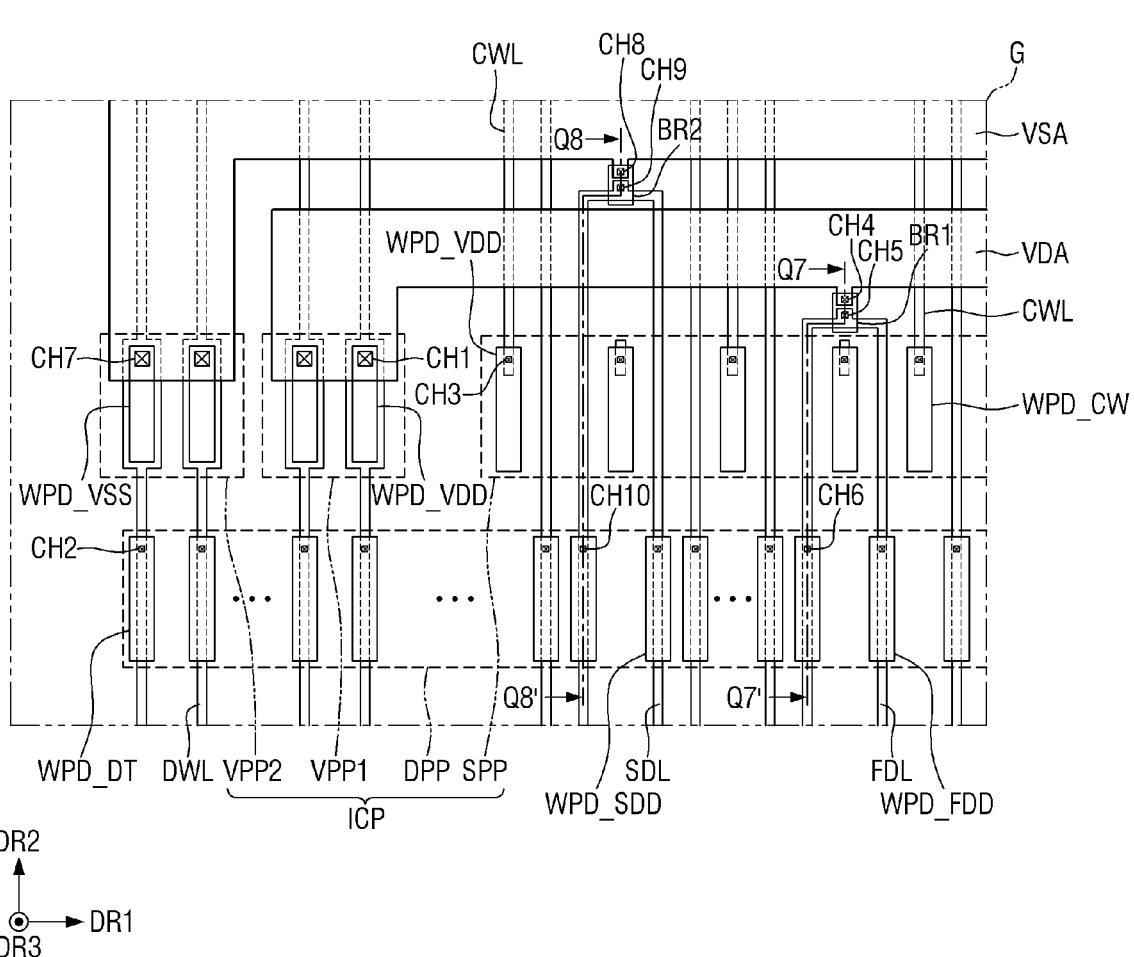
FIG. 21 is an enlarged schematic plan view of area G of FIG. 20.
Figure 22:
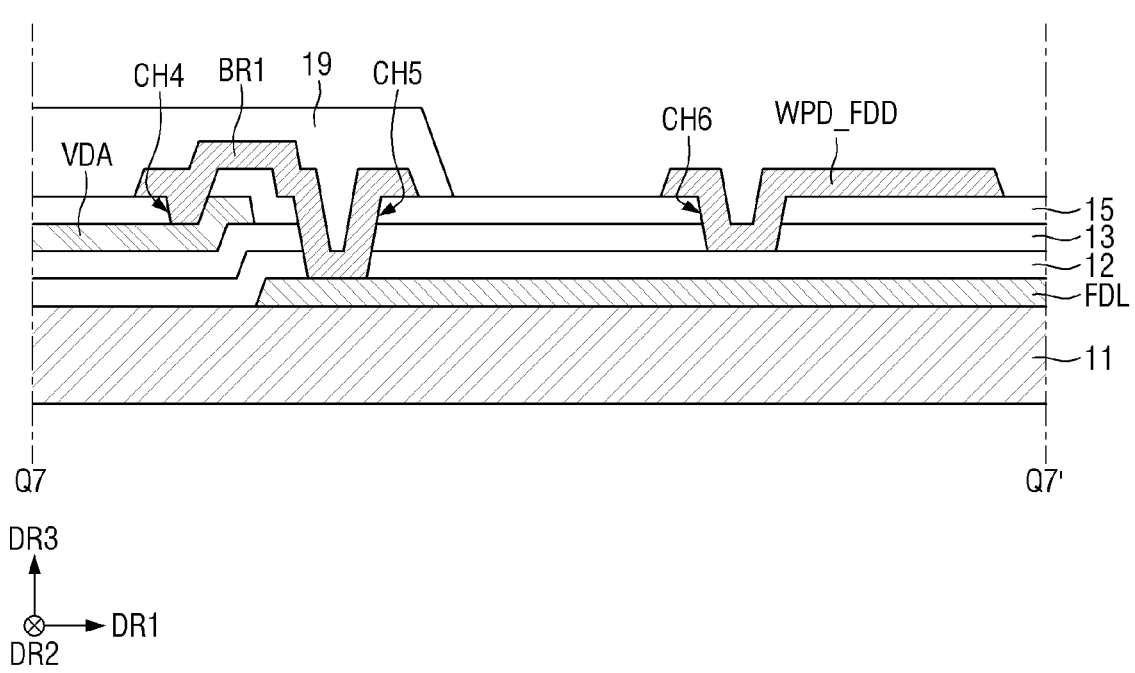
FIG. 22 is a schematic cross-sectional view taken along line Q7-Q7' of FIG. 21.
Figure 23:
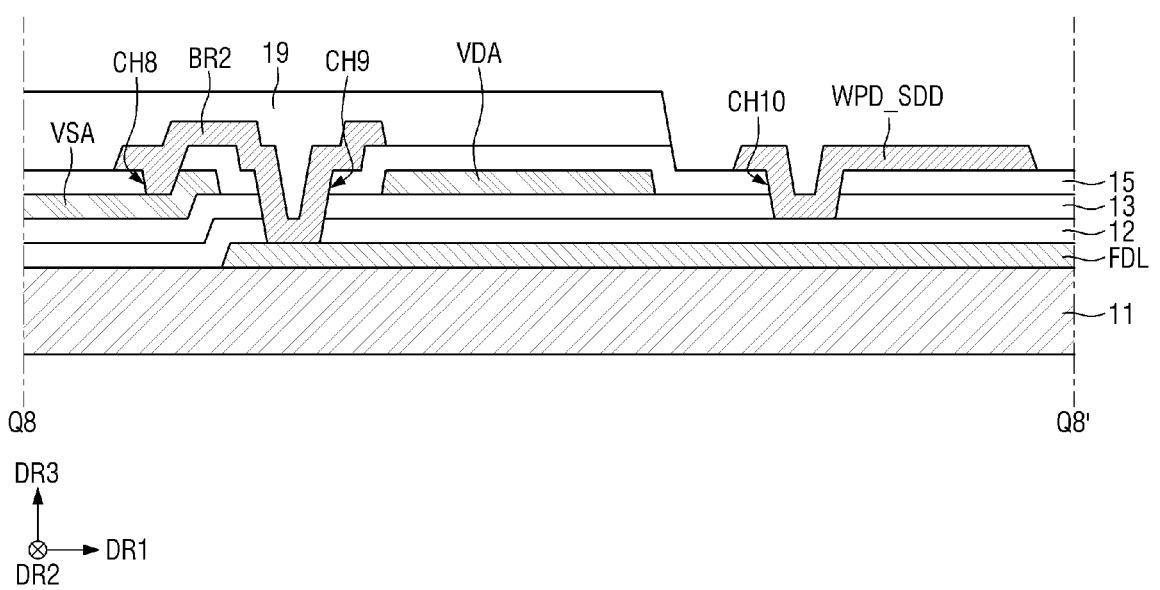
FIG. 23 is a schematic cross-sectional view taken along line Q8-Q8' of FIG. 21.

FIG. 20 is a schematic plan view illustrating a non-display area of a display device according to still another embodiment. FIG. 21 is an enlarged schematic plan view of area G of FIG. 20. FIG. 22 is a schematic cross-sectional view taken along line Q7-Q7' of FIG. 21. FIG. 23 is a schematic cross-sectional view taken along line Q8-Q8' of FIG. 21.

Referring to FIGS. 20 to 23, an embodiment may be different from the above-described embodiments at least in that the second voltage common line VSA may be disposed to surround the first voltage common line VDA with respect to the driving integrated circuit IC. In the following description, redundant description of the above-described embodiments will be omitted while focusing on differences.

In the display device 10 according to an embodiment, the first voltage common line VDA and the second voltage common line VSA may be disposed in the non-display area NDA adjacent to the driving integrated circuit IC. An end and another end of the first voltage common line VDA may be connected to the driving integrated circuit IC. An end and another end of the second voltage common line VSA may be connected to the driving integrated circuit IC. The second voltage common line VSA may be disposed to surround the first voltage common line VDA in plan view, and may be disposed closer to the display area DPA than the first voltage common line VDA.

The first voltage common line VDA and the second voltage common line VSA described above may each be formed of the first data conductive layer, and may be disposed to be spaced apart from each other in plan view.

The pad portion ICP may include the first power pad portion VPP1 connected to the first voltage common line VDA, the second power pad portion VPP2 connected to the second voltage common line VSA, the scan pad portion SPP connected to the scan routing lines CWL, and the data pad portion DPP connected to the data routing lines DWL.

The data pad portion DPP may be disposed at the outermost part and may be disposed to extend in the first direction DR1. The scan pad portion SPP, the first power pad portion VPP1, and the second power pad portion VPP2 may be disposed between the display area DPA and the data pad portion DPP. The first power pad portion VPP1 and the scan pad portion SPP may be disposed adjacent to each other, and the second power pad portion VPP2 may be disposed adjacent to the scan pad portion SPP with the first power pad portion VPP1 interposed therebetween.

The first voltage common line VDA may extend to the first power pad portion VPP1 to overlap the first power pad portion VPP1. The first power pad WPD_VDD may be disposed in the first power pad portion VPP1. The first voltage common line VDA may be directly connected to the first power pad WPD_VDD through a first contact hole CH1. The second voltage common line VSA may extend to the second power pad portion VPP2 to overlap the second power pad portion VPP2. The second power pad WPD_VSS may be disposed in the second power pad portion VPP2. The second voltage common line VSA may be directly connected to the second power pad WPD_VSS through a seventh contact hole CH7. The first power pad portion VPP1 and the second power pad portion VPP2 may be disposed adjacent to each other.

The data routing lines DWL may be disposed in the non-display area NDA. The data routing lines DWL may extend in the second direction DR2 to overlap and cross the first voltage common line VDA and the second voltage common line VSA. The data routing lines DWL may partially overlap the first power pad WPD_VDD and the second power pad WPD_VSS, and may extend to the data pad portion DPP. The data pads WPD_DT may be disposed in the data pad portion DPP to be spaced apart from each other in the first direction DR1. The data routing lines DWL may be directly connected to the data pads WPD_DT through a second contact hole CH2.

The scan routing lines CWL may extend to the non-display area NDA. The scan routing lines CWL may extend in the second direction DR2 to overlap and cross the first voltage common line VDA and the second voltage common line VSA. The scan routing lines CWL may extend to the scan pad portion SPP of the pad portion ICP. The scan pads WPD_CW may be disposed in the scan pad portion SPP to be spaced apart from each other in the first direction DR1. The scan routing lines CWL may be directly connected to the scan pad WPD_CW through a third contact hole CH3.

The data routing lines DWL and the scan routing lines CWL described above may be formed of the first lower conductive layer, which may be the same as the light blocking layer BML. The scan pads WPD_CW, the data pads WPD_DT, the first power pads WPD_VDD, and the second power pads WPD_VSS may be formed of the first data conductive layer.

In an embodiment, the first voltage common line VDA may be connected to the driving integrated circuit IC through the first auxiliary lines FDL in a region other than the first power pad VPP1, and the second voltage common line VSA may be connected to the driving integrated circuit IC through the second auxiliary lines SDL in a region other than the second power pad VPP2.

Referring to FIGS. 21 to 23, the first auxiliary lines FDL may be disposed to extend in the second direction DR2 in the non-display area NDA. The first auxiliary lines FDL may be disposed adjacent to the first voltage common line VDA while overlapping the pad portion ICP.

The first bridge layer BR1 may be disposed between the first voltage common line VDA and the scan pad portion SPP. The first bridge layer BR1 may be disposed between the first voltage common line VDA and the first auxiliary lines FDL while overlapping each of them. Some of the first auxiliary lines FDL, for example, two first auxiliary lines FDL may be integrated with each other in a region overlapping the first bridge layer BR1. For example, the two first auxiliary lines FDL may overlap the first bridge layer BR1. The first bridge layer BR1 may be directly connected to the first voltage common line VDA through a fourth contact hole CH4 penetrating the first interlayer insulating layer 15 to expose the first voltage common line VDA. The first bridge layer BR1 may be directly connected to the first auxiliary line FDL through a fifth contact hole CH5 penetrating the buffer layer 12, the first gate insulating layer 13, and the first interlayer insulating layer 15 to expose the first auxiliary line FDL. Accordingly, the first voltage common line VDA and the first auxiliary line FDL may be electrically connected through the first bridge layer BR1.

The first auxiliary lines FDL may extend to overlap the scan pad portion SPP and the data pad portion DPP. The first auxiliary lines FDL may not overlap the second voltage common line VSA. The first auxiliary pads WPD_FDD may be disposed in the data pad portion DPP. The first auxiliary pads WPD_FDD connected to the first auxiliary lines FDL may be disposed between the data pads WPD_DT of the data pad portion DPP. The first auxiliary pads WPD_FDD may be directly connected to the first auxiliary line FDL through a sixth contact hole CH6 penetrating the buffer layer 12, the first gate insulating layer 13, and the first interlayer insulating layer 15 to expose the first auxiliary line FDL. Accordingly, the first power signal applied through the first auxiliary pad WPD_FDD may be applied to the first voltage common line VDA through the first auxiliary lines FDL.

As shown in FIG. 22, the first planarization layer 19 may be disposed in the non-display area NDA where the first bridge layer BR1 may be disposed, but may not be disposed in the scan pad portion SPP and the data pad portion DPP. For example, since the first planarization layer 19 may not be disposed in the pad portion ICP, electrical connection between the driving integrated circuit IC and the pads may be well achieved due to the step caused by the first planarization layer 19.

In an embodiment, the second voltage common line VSA may be connected to the driving integrated circuit IC through the second auxiliary lines SDL in a region other than the second power pad VPP2. The second auxiliary lines SDL may be disposed to extend in the second direction DR2 in the non-display area NDA. The second auxiliary lines SDL may be disposed adjacent to the second voltage common line VSA while overlapping the pad portion ICP.

The second bridge layer BR2 may be disposed between the second voltage common line VSA and the first voltage common line VDA. The second bridge layer BR2 may be disposed between the second voltage common line VSA and the scan pad portion SPP. A portion of the second bridge layer BR2 may overlap the second voltage common line VSA and another part thereof may overlap the second auxiliary lines SDL. Some of the second auxiliary lines SDL, for example, two second auxiliary lines SDL may be integrated with each other in a region overlapping the second bridge layer BR2. For example, the two second auxiliary lines SDL may overlap the second bridge layer BR2. The second bridge layer BR2 may be directly connected to the second voltage common line VSA through an eighth contact hole CH8 penetrating the first interlayer insulating layer 15 to expose the second voltage common line VSA. The second bridge layer BR2 may be directly connected to the second auxiliary line SDL through a ninth contact hole CH9 penetrating the buffer layer 12, the first gate insulating layer 13, and the first interlayer insulating layer 15 to expose the second auxiliary line SDL. Accordingly, the second voltage common line VSA and the second auxiliary line SDL may be electrically connected to each other through the second bridge layer BR2.

The second auxiliary lines SDL may extend to overlap the first voltage common line VDA, the scan pad portion SPP, and the data pad portion DPP. The second auxiliary pads WPD_SDD may be disposed in the data pad portion DPP. The second auxiliary pads WPD_SDD connected to the second auxiliary lines SDL may be disposed between the data pads WPD_DT of the data pad portion DPP. The second auxiliary pads WPD_SDD may be directly connected to the second auxiliary line SDL through a tenth contact hole CH10 penetrating the buffer layer 12, the first gate insulating layer 13, and the first interlayer insulating layer 15 to expose the second auxiliary line SDL. Accordingly, the second power signal applied through the second auxiliary pad WPD_SDD may be applied to the second voltage common line VSA through the second auxiliary lines SDL.

The first auxiliary lines FDL and the second auxiliary lines SDL described above may be spaced apart from each other in the first direction DR1 and may be alternately and repeatedly arranged. However, the disclosure is not limited thereto, and some may alternate and some may not. Although it has been described as an example in the above-described embodiment that the first auxiliary pads WPD_FDD and the second auxiliary pads WPD_SDD may not be disposed in the data pad portion DPP, the disclosure is not limited thereto, and they may be disposed in the scan pad portion SPP as shown in FIG. 17.

As described above, the voltage signals may be uniformly applied to the entire first voltage common line and the entire second voltage common line through the first auxiliary lines FDL and the second auxiliary lines SDL as well as a region adjacent to a side of the driving integrated circuit IC. Therefore, the display quality of the display device 10 may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a display area;
   a non-display area;
   a pad portion disposed in the non-display area and including a first power pad portion, a second power pad portion, a data pad portion, and a scan pad portion;
   a first voltage common line and a second voltage common line that are disposed between the pad portion and the display area and spaced apart from each other;
   a first power pad disposed in the first power pad portion and electrically connected to the first voltage common line;
   a second power pad disposed in the second power pad portion and electrically connected to the second voltage common line;
   first auxiliary lines electrically connected to the first voltage common line and extending from the pad portion; and
   second auxiliary lines electrically connected to the second voltage common line and extending from the pad portion,
   wherein the first auxiliary lines and the second auxiliary lines are spaced apart from the first power pad portion and the second power pad portion,
   wherein the first auxiliary lines overlap at least one of the scan pad portion or the data pad portion, and
   wherein the second auxiliary lines overlap at least one of the scan pad portion or the data pad portion.

2. The display device of claim 1, further comprising:
   data routing lines extending to the pad portion; and
   scan routing lines extending to the pad portion, wherein
      the data routing lines are electrically connected to the data pad portion; and
      the scan routing lines are electrically connected to the scan pad portion.

3. The display device of claim 2, wherein
   the data pad portion faces the first voltage common line and the second voltage common line, the scan pad portion is disposed between the first voltage common line and the data pad portion and between the second voltage common line and the data pad portion, the first power pad portion is disposed on a side of the scan pad portion, and the second power pad portion is disposed on another side of the scan pad portion.

4. The display device of claim 2, further comprising:

first bridge layers disposed between the scan pad portion and the first voltage common line; and second bridge layers disposed between the scan pad portion and the second voltage common line, wherein the first auxiliary lines are electrically connected to the first voltage common line through the first bridge layer, and the second auxiliary lines are electrically connected to the second voltage common line through the second bridge layer.

5. The display device of claim 4, further comprising:

first auxiliary pads and second auxiliary pads that are disposed in the data pad portion, wherein the first auxiliary lines are electrically connected to the first auxiliary pads, and the second auxiliary lines are electrically connected to the second auxiliary pads.

6. The display device of claim 5, wherein the first voltage common line, the first auxiliary lines, and the first bridge layers are disposed on different layers, and the second voltage common line, the second auxiliary lines, and the second bridge layers are disposed on different layers.

7. The display device of claim 6, wherein the first auxiliary pads and the first bridge layers are disposed on a same layer, and the second auxiliary pads and the second bridge layers are disposed on a same layer.

8. The display device of claim 5, further comprising:

scan pads disposed in the scan pad portion and to which the scan routing lines are electrically connected; and data pads disposed in the data pad portion and to which the data routing lines are electrically connected, wherein the first auxiliary pads and the second auxiliary pads are disposed between the data pads.

9. The display device of claim 4, further comprising:

first auxiliary pads and second auxiliary pads that are disposed in the scan pad portion, wherein the first auxiliary lines are electrically connected to the first auxiliary pads, and the second auxiliary lines are electrically connected to the second auxiliary pads.

10. The display device of claim 9, further comprising:

scan pads disposed in the scan pad portion and to which the scan routing lines are electrically connected; and data pads disposed in the data pad portion and to which the data routing lines are electrically connected, wherein the first auxiliary pads and the second auxiliary pads are disposed between the data pads.

11. The display device of claim 2, further comprising:

a scan dummy line disposed between the first auxiliary lines; and a scan dummy pad to which the scan dummy line is connected, wherein the scan dummy line is floating state.

12. An electronic device comprising:

a display area;

a non-display area;

a pad portion disposed in the non-display area and including a first power pad portion, a second power pad portion, a data pad portion, and a scan pad portion;

a first voltage common line and a second voltage common line that are disposed between the pad portion and the display area and spaced apart from each other;

a first power pad disposed in the first power pad portion and electrically connected to the first voltage common line;

a second power pad disposed in the second power pad portion and electrically connected to the second voltage common line;

first auxiliary lines electrically connected to the first voltage common line and extending from the pad portion; and second auxiliary lines electrically connected to the second voltage common line and extending from the pad portion, wherein the first auxiliary lines and the second auxiliary lines are spaced apart from the first power pad portion and the second power pad portion, wherein the first auxiliary lines overlap at least one of the scan pad portion or the data pad portion, and wherein the second auxiliary lines overlap at least one of the scan pad portion or the data pad portion.

* * * * *